(12) United States Patent
Wu et al.

(10) Patent No.: US 6,433,921 B1
(45) Date of Patent: Aug. 13, 2002

(54) MULTIWAVELENGTH PUMPS FOR RAMAN AMPLIFIER SYSTEMS

(75) Inventors: Yongan Wu, San Jose; G. Victor Treyz, San Carlos, both of CA (US)

(73) Assignee: Onetta, Inc., Sunnyvale, CA (US)

( * ) Notice: Subject to any disclaimer, the term of this patent is extended or adjusted under 35 U.S.C. 154(b) by 0 days.

(21) Appl. No.: 09/783,395

(22) Filed: Feb. 15, 2001

Related U.S. Application Data

(60) Provisional application No. 60/260,884, filed on Jan. 12, 2001.

(51) Int. Cl.[7] .................................................. H01S 3/00
(52) U.S. Cl. .............. 359/334; 359/341.31; 359/341.33
(58) Field of Search ........................... 359/334, 341.31, 359/341.33

(56) References Cited

U.S. PATENT DOCUMENTS

| | | | |
|---|---|---|---|
| 4,379,289 A | 4/1983 | Peek | 340/555 |
| 4,651,317 A | 3/1987 | Tashiro et al. | 380/86 |
| 4,745,612 A | 5/1988 | Hayakawa et al. | 372/45 |
| 4,881,790 A | 11/1989 | Mollenauer | 350/96.16 |
| 5,039,194 A | 8/1991 | Block et al. | 383/88 |
| 5,136,410 A | 8/1992 | Heiling et al. | 359/110 |
| 5,189,679 A | 2/1993 | Derry et al. | 372/45 |
| 5,208,183 A | 5/1993 | Chen et al. | 437/129 |
| 5,218,613 A | 6/1993 | Serreze | 372/45 |
| 5,287,377 A | 2/1994 | Fukuzawa et al. | 372/45 |
| 5,345,456 A | 9/1994 | Dai et al. | 372/22 |
| 5,428,471 A | 6/1995 | McDermott | 359/177 |
| 5,430,759 A | 7/1995 | Yokev et al. | 375/202 |
| 5,623,508 A | 4/1997 | Grubb et al. | 372/3 |
| 5,673,280 A | 9/1997 | Grubb et al. | 372/3 |
| 5,920,423 A | * 7/1999 | Grubb et al. | 359/341 |
| 5,936,763 A | * 8/1999 | Mitsuda et al. | 359/341 |
| 5,945,668 A | 8/1999 | Davidson | 250/277.15 |
| 5,946,129 A | 8/1999 | Xu et al. | 359/332 |
| 5,959,750 A | 9/1999 | Eskildsen et al. | 359/134 |

(List continued on next page.)

FOREIGN PATENT DOCUMENTS

| | | |
|---|---|---|
| WO | WO 99/66607 | 12/1999 |
| WO | WO 00/49721 | 8/2000 |
| WO | WO 00/73849 A1 | 12/2000 |

OTHER PUBLICATIONS

Silver et al. "Design and ASE Characteristics of 1550–nm Polarization Insensitive Semiconductor Optical Amplifiers Containing Tensile and Compressive Wells" IEEE Journal of Quantum Electronics, vol. 36, No. 1, pp. 118–122, Jan., 2000.

Ryu et al. "Fabrication and Analysis of Polarization Insensitive 1.55um InGaAsP/InP Quantum Well Semiconductor Optical Amplifiers" p. 642.

Liu et al. "A Study on the Polarization Sensitive Performance of the Strained Quantum Well Semiconductor Optical Amplifiers," SPIE vol. 3896, pp. 494–498 Nov., Dec., 1999.

(List continued on next page.)

*Primary Examiner*—Mark Hellner
(74) *Attorney, Agent, or Firm*—Fish & Neave; G. Victor Treyz

(57) ABSTRACT

Multiwavelength Raman pumps for Raman amplifiers are provided. The multiwavelength Raman pumps may be based on semiconductor devices that have multiple source regions, each of which handles pump light at a different wavelength. An optical coupler such as a lens and isolator arrangement or an integral fiber lens may be used to couple pump light from the multiwavelength Raman pump into a fiber. A depolarizer may be used to depolarize the Raman pump light provided by the Raman pump. Gratings may be used to define the lasing wavelengths for the Raman pump. A number of tunable sources may be used on the semiconductor device. A fiber Bragg grating may be used to form an external cavity or coupled cavity arrangement for the semiconductor device.

4 Claims, 25 Drawing Sheets

U.S. PATENT DOCUMENTS

| | | | | |
|---|---|---|---|---|
| 6,014,235 | A | 1/2000 | Norte | 359/109 |
| 6,028,875 | A | 2/2000 | Knight et al. | 372/46 |
| 6,052,222 | A | 4/2000 | Kitamaura | 359/344 |
| 6,052,393 | A | 4/2000 | Islam | 372/6 |
| 6,115,174 | A | 9/2000 | Grubb et al. | 359/334 |
| 6,122,306 | A | 9/2000 | Sartorious et al. | 372/96 |
| 6,141,477 | A | 10/2000 | Kitamura | 385/313 |
| 6,147,794 | A | 11/2000 | Stentz | 359/334 |
| 6,151,160 | A | 11/2000 | Ma et al. | 359/341 |
| 6,163,636 | A | 12/2000 | Stentz et al. | 385/24 |
| 6,178,038 | B1 | 1/2001 | Taylor et al. | 359/341 |
| 6,181,464 | B1 | 1/2001 | Kidorf et al. | 359/334 |
| 6,192,058 | B1 | 2/2001 | Abeles | 372/6 |
| 6,215,805 | B1 | 4/2001 | Sartorious et al. | 372/50 |
| 6,275,313 | B1 | 8/2001 | Denkin et al. | 359/124 |
| 6,292,288 | B1 * | 9/2001 | Akasaka et al. | 359/334 |
| 6,320,695 | B1 * | 11/2001 | Tanaka et al. | 359/341.33 |

OTHER PUBLICATIONS

Schimpe et al. "Compact 2×2 Switch with Optical Amplifier Gates" CLEO, 1994, p. 77.

Zhu et al. "1.28 Tbit/s (32×40 Gbit/s) Transmission over 1000 km NDSF Employing Distributed Raman Amplification and Active Gain Flattening" Electronics Letters, vol. 37, No. 1, pp. 43–45 (Jan. 4, 2001).

Emori et al. "Cost–Efficive Depolarization Diode Pump Unit Designed for C–band Flat Gain Raman Amplifiers to Control EDFA Gain Profile" pp. 106–108.

Takeda et al. "Active Gain Tilt Equalization by Preferentially 1.43$\mu$m–or 1.48$\mu$m–Pumped Raman Amplification" OSA Optical Amplifiers and their Applications, vol. 30, pp. 101–105 (1999).

Bouda et al. "Compact High–Power Wavelength Selectable Lasers for WDM Applications" 25th Optical Fiber Communication Conference, Technical Digest, pp. 178–180 (Mar. 7, 2000).

Moller et al. "Mode Stabilized Technique for the Multifrequency Laser" 25th Optical Fiber Commnuication Conference, Technical Digest, pp. 187–189 (Mar. 7, 2000).

Kudo et al. "1.55$\mu$m Wavelength–Selectable Microarray DFB–LD's with Integrated MMI Combiner, SOA, and EA–Modulator" 25th Optical Fiber Communication Conference, Technical Digest, pp. 190–192 (Mar. 7, 2000).

Doerr et al. "Chromatic Focal Plane Displacement in the Parabolic Chirped Waveguide Grating Router" IEEE Photonics Technology Letters, vol. 9, No. 5, (May 5, 1997).

Masuda "Review of Wideband Hybrid Amplifiers" $25^{th}$ Optical Fiber Communication Conference, Technical Digest, pp. 2–4 (Mar, 7, 2000).

Lewis et al. "Low–Noise High Gain Dispersion Compensating Broadband Raman Amplifier" $25^{th}$ Optical Fiber Communication Conference, Technical Digest, pp. 5–7, (Mar. 7, 2000).

Fludger et al. "Inline Loopbacks for Improved OSNR and Reduced Double Rayleigh Scattering in Distributed Raman Amplifiers" OFC.

Stentz "Progress on Raman Amplifiers" OFC '97 Technical Digest, p. 343.

Hansen et al. "Raman Amplification for Loss Compensation in Dispersion Compensating Fibre Modules" Electronics Letters, vol. 34, No. 11, pp. 1136–1137, May 28, 1998.

Emori et al. "Broadband Lossless DCF using Raman Amplification Pumped by Multichannel WDM Laser Diodes" Electronics Letters, vol. 34, No. 22, Oct. 29, 1998.

Neilson et al. "10 Gbit/s Repeaterless Transmission at 1.3 $\mu$m with 55.1–dB Power Budget using Raman Post and Preamplifier" OFC '98 Technical Digest, pp. 52–53.

Stentz et al. "Raman Amplifier with Improved System Performance" OFC '96 Technical Digest, pp. 16–17.

Kitamura et al. "Angled Facet S–Bend Semiconductor Optical Amplifiers for High–Gain and Large–Extinction Ratio" IEEE Photonics Technology Letters, vol. 11, No. 7 (Jul., 1999).

Saini et al. "Lossless 1×2 Optical Switch Monolithically Integrated on a Passive Active Resonant Coupler (PARC) Platform" IEEE Photonics Technology Letters, vol. 12, No. 7, Jul. 2000.

* cited by examiner

MULTIWAVELENGTH PUMPS FOR RAMAN AMPLIFIER SYSTEMS

This application claims the benefit of provisional patent application No. 60/260,884, filed Jan. 12, 2001.

BACKGROUND OF THE INVENTION

The present invention relates to fiber-optic communications networks, and more particularly, to multiwavelength pump systems for Raman amplifiers in fiber-optic communications networks.

Fiber-optic networks are used to support voice and data communications. In optical networks that use wavelength division multiplexing, multiple wavelengths of light are used to support multiple communications channels on a single fiber.

Optical amplifiers are used in fiber-optic networks to amplify optical signals. For example, optical amplifiers may be used to amplify optical data signals that have been subject to attenuation over fiber-optic links. A typical amplifier may include erbium-doped fiber coils that are pumped with diode lasers. Raman amplifiers have also been investigated. Discrete Raman amplifiers may use coils of fiber to provide Raman gain. Distributed Raman amplifiers provide gain in the transmission fiber spans that are used to carry optical data signals between network nodes.

The fiber in Raman amplifiers may be pumped by single-wavelength sources. However, the Raman gain spectrum produced by a single-wavelength source often does not have the spectral shape that is desired.

Amplifier systems with non-flat gain spectra amplify optical signals on channels at different wavelengths by different amounts. This is often not acceptable, particularly in communications links with a number of cascaded amplifiers. Moreover, other non-flat spectral shapes may be desired.

The gain spectrum of a Raman amplifier may be modified using a spectral filter. For example, a gain equalization filter may be used to produce a relatively flat gain spectrum by introducing optical losses that compensate for the non-flat shape of the Raman gain spectrum. However, the optical losses associated with using the filter consume optical power and tend to increase the noise figure of the Raman amplifier.

Another approach for pumping Raman amplifiers involves using a Raman pump source based on multiple diode laser pumps, each of which operates at a different pump wavelength. With this type of approach, the diode laser pumps are each driven at an appropriate current to provide a Raman gain contribution. The overall gain of the Raman amplifier is determined by the Raman gain contributions of each of the individual Raman pump lasers.

If a sufficient number of diode laser pumps are used, the overall gain of the Raman amplifier may be made flat. Because gain equalization filters are avoided, the noise figure of the Raman amplifier may be improved. However, coupling the pump light from each of the individual diode lasers into a single fiber for use in a Raman amplifier may be complex, bulky, and costly.

It is therefore an object of the present invention to provide Raman pumps that produce multiple Raman pump wavelengths.

SUMMARY OF THE INVENTION

This and other objects of the invention are accomplished in accordance with the present invention by providing multiwavelength light sources that may be used as Raman pumps for Raman amplifiers. The Raman amplifiers based on the multiwavelength pumps may be used in fiber-optic communications networks having communications links that support channels operating at one or more different wavelengths. The Raman amplifiers may be based on distributed or discrete Raman amplifier arrangements. Raman gain may be provided by pumping fiber with the multiwavelength Raman pump. The fiber may include one or more coils of fiber such as dispersion-compensating fiber, may be a span of transmission fiber, or may be any suitable combination of coils and transmission fiber spans.

The gain spectrum produced by pumping the fiber in a Raman amplifier with the multiwavelength Raman pump may be flat or may have another desired spectral shape. The Raman amplifier may have a control unit. The control unit may be used to control the operation of the Raman pump. For example, the control unit may be used to adjust the pump power produced at each of the pump wavelengths to produce the desired spectral shape for the Raman gain. The control unit may be used to adjust the pump power produced at each of the pump wavelengths to produce the desired spectral Raman gain shape for different types of gain fibers.

Optical monitoring equipment may be used to measure optical signals on the fiber-optic communications link. The optical signal measurements may be used by the control unit in adjusting the pump powers produced by the multiwavelength Raman pump. Monitoring equipment may also be used to measure the pump powers at each of the pump wavelengths. The optical monitoring equipment may be integrated with the pump module.

A power amplifier stage may be used to increase the optical power from the Raman pump that is used to pump the fiber in the Raman amplifier. The power amplifier stage may be an external semiconductor optical amplifier or a fiber amplifier or may be a semiconductor optical amplifier stage that is integrated with the Raman pump.

The multiwavelength Raman pump may be based on a semiconductor device. The device may have multiple waveguide gain sections with different distributed feedback gratings for providing optical feedback at different pump wavelengths. Light from each of the waveguide gain sections may be combined using a multiplexer such as a wavelength multiplexer or a simple Y-junction coupler on the semiconductor device.

An optical coupler such as a lens and isolator arrangement or an integral fiber lens may be used to couple pump light from the multiwavelength Raman pump into a single fiber. The single fiber may be coupled to a fiber that is to be Raman-pumped to produce Raman gain using a pump coupler.

The semiconductor device may be mounted on a heat sink. A temperature sensor may be used to monitor the heat sink temperature. A thermoelectric cooling element may be used to maintain the heat sink and semiconductor device at a desired temperature.

A depolarizer may be used to depolarize the Raman pump light provided by the Raman pump. This allows unpolarized Raman gain to be produced in the Raman-pumped fiber.

Gratings may be used to define the lasing wavelengths for the Raman pump. The gratings may be chirped. A relatively small number of grating periods may be used in a grating to broaden the pump linewidth.

A number of tunable sources may be used on a single semiconductor device to provide the multiple pump wavelengths. Tunable sources may be based on waveguide gain sections that have multiple grating regions, each of which has a grating with a different periodicity. Tunable sources may also be provided that use multiple waveguide layers. The wavelength of light produced by such a layered structure may be selected by adjusting the drive current through a grating region on the structure.

The active region on the semiconductor Raman pump device may be provided using multiple quantum wells. The gain spectra of the multiple quantum wells may be configured to provide gain peaks in the vicinity of each of the pump wavelengths.

The active region on the semiconductor Raman pump device may be provided using multiple quantum wires or quantum dots. The gain spectra of the multiple quantum wires or quantum dots may be configured to provide gain peaks in the vicinity of each of the pump wavelengths.

A fiber Bragg grating may be used to form an external cavity or coupled cavity arrangement for the semiconductor device. The fiber may have multiple gratings, each of which corresponds to a different pump wavelength.

Further features of the invention and its nature and various advantages will be more apparent from the accompanying drawings and the following detailed description of the preferred embodiments.

DETAILED DESCRIPTION OF THE PREFERRED EMBODIMENTS

Figure 1:
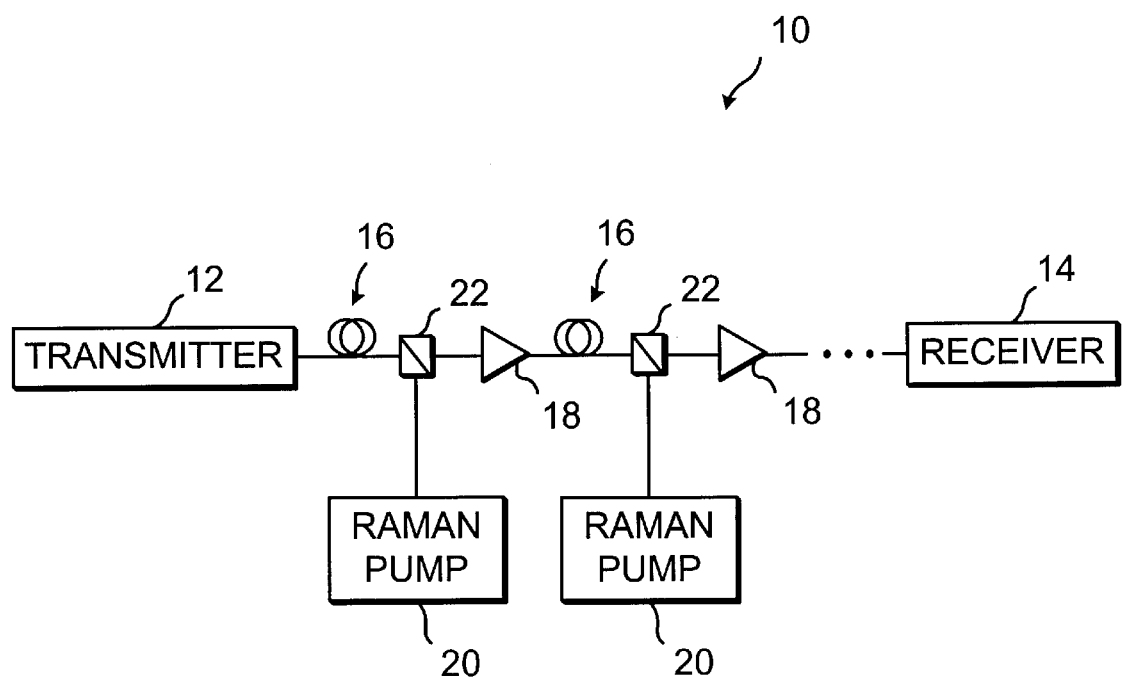
FIG. 1 is a schematic diagram of an illustrative fiber-optic communications link including Raman amplifier equipment in accordance with the present invention.

An illustrative optical communications network link 10 with Raman amplifier equipment in an optical communications network in accordance with the present invention is shown in FIG. 1. A transmitter 12 may transmit information to a receiver 14 over a series of fiber links. Each fiber link may include a span 16 of optical transmission fiber. Fiber spans 16 may be on the order of 40–160 km in length for long-haul networks or may be any other suitable length for use in signal transmission in an optical communications network.

The communications link of FIG. 1 may be used to support wavelength division multiplexing arrangements in which multiple communications channels are provided using multiple wavelengths of light. For example, the link of FIG. 1 may support a system with 40 channels, each using a different optical carrier wavelength. Optical channels may be modulated at, for example, approximately 10 Gbps (OC-192). The carrier wavelengths that are used may be in the vicinity of 1520–1565 nm. These are merely illustrative system characteristics. If desired, a single channel may be provided or more channels may be provided (e.g., hundreds of channels), signals may be carried on multiple wavelengths, signals may be modulated at slower or faster data rates (e.g., at approximately 2.5 Gbps for OC-48 or at approximately 40 Gbps for OC-768), and different carrier wavelengths may be supported (e.g., wavelengths in the range of 1240–1650 nm).

Optical amplifiers 18 may be used to amplify optical signals between successive spans of fiber 16. Optical amplifiers 18 may be based on erbium-doped amplifier stages or other rare-earth-doped fiber amplifier stages, may be based on semiconductor optical amplifier stages, may be based on discrete Raman amplifier stages, may be based on other suitable amplifier stages, or may be based on combinations of such stages.

Fiber spans 16 may be Raman-pumped using multiwavelength Raman pumps 20. This creates Raman gain in spans 16 that counteracts the attenuation normally experienced along spans 16. The arrangement shown in FIG. 1 is a counterpumping arrangement, but distributed Raman amplifiers of this type may also be provided using copumping or using a combination of counterpumping and copumping.

Raman pumps 20 may be polarized or unpolarized. An advantage of using unpolarized pumps is that such pumps do not create polarization-dependent gain in spans 16. Pump light from pumps 20 may be coupled into fiber spans 16 using pump couplers 22. Pump couplers 22 may be, for example, wavelength-division multiplexing (WDM) couplers or couplers based on circulators or other suitable pump coupling arrangements.

Figure 2:
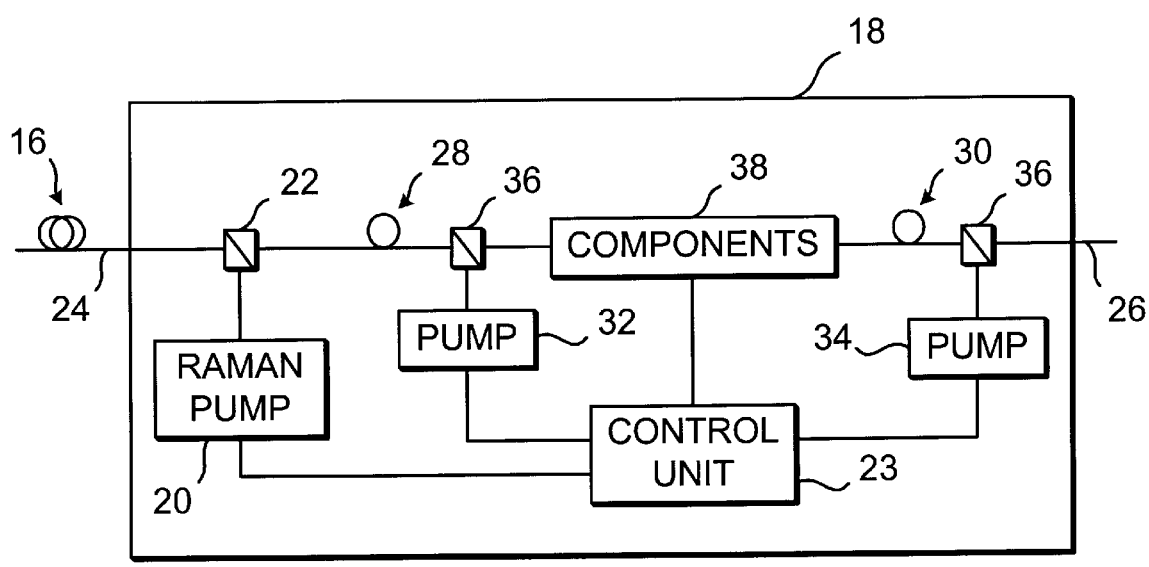
FIG. 2 is a schematic diagram of illustrative amplifier equipment including a distributed Raman amplifier and an erbium-doped fiber amplifier in accordance with the present invention.

An illustrative optical amplifier 18 with an integral multiwavelength Raman pump 20 is shown in FIG. 2. In the example of FIG. 2, Raman pump 20 provides light at multiple pump wavelengths for pumping span 16. Pump 20 may be controlled by control unit 23. Control unit 23 may also be used to control other components in amplifier 18. The arrangement of FIG. 2 is merely illustrative. Raman pump 20 may be provided as part of an amplifier or other suitable optical network equipment or may be provided as stand-alone equipment.

In the amplifier 18 of FIG. 2, optical input signals from span 16 are provided to input 24 and corresponding output signals that have been amplified by amplifier 18 are provided at output 26. Optical gain may be provided by rare-earth-doped fiber coils such as erbium-doped fiber coils 28 and 30. Although only two coils are shown in the example of FIG. 2, this is merely illustrative. One coil, three coils, or more coils may be used if desired.

Coils 28 and 30 may be optically pumped by pumps 32 and 34. Pumps 32 and 34 may be laser diode pumps operating at 980 nm or 1480 nm or other suitable pump wavelengths or may be any other suitable sources of pump light. Pump couplers 36 may be used to couple pump light from pumps 32 and 34 into coils 28 and 30. In the example of FIG. 2, coils 28 and 30 are counterpumped. If desired, such coils may be copumped or both copumped and counterpumped.

The illustrative amplifier 18 is somewhat simplified to avoid over-complicating the drawing. In general, amplifier 18 may have additional components such as components 38. In the example of FIG. 2, components 38 are located in the fiber path between pump coupler 36 and coil 30. This is merely illustrative. Components 38 may be used at any suitable location in the fiber path in amplifier 18. Components 38 may include taps for optical monitoring, filters such as gain equalization filters, wavelength-division-multiplexing couplers, circulators, isolators, attenuators, dispersion-compensating elements, etc.

Control unit 23 may be based on any suitable control electronics and may include one or more microprocessors, microcontrollers, digital signal processors, programmable logic devices, application-specific integrated circuits, digital-to-analog converters, analog-to-digital converters, analog control circuits, memory devices, etc.

Control unit 23 may include communications circuitry for communicating with network equipment. For example, control unit 23 may include communications circuitry for communicating with a network control and management system over a communications path. The communications path may be a telemetry channel that uses a particular wavelength on the communications link 10. The communications path may also be based on a wireless path or may be based on a communications arrangement in which the normal data channels on link 10 are modulated at a low frequency and relatively small modulation depth on top of the normal data carried on those channels.

The network control and management system may be implemented on suitable network computer equipment. The network control and management system may send commands to control unit 23 that direct amplifier 18 to establish a particular gain setting or output power setting. The network control and management system may adjust the settings of pump 20 and may adjust other amplifier settings. Control unit 23 may assist in the gathering of data on the operation of amplifier 18. For example, control unit 23 may be used to gather information on the pump powers produced at the different pump wavelengths in pump 20. The status and operational data collected by control unit 23 may be provided to the network control and management system by the control unit over the communications link.

Control unit 23 may be used to suppress gain transients due to fluctuations in the input powers of the signals provided to input 24. Any suitable gain transient suppression arrangement may be used. As an example, control unit 23 may use optical taps and monitoring circuitry to measure input and output powers in amplifier 18. The measured input and output powers may be used to determine the amplifier gain. Control unit 23 may adjust the powers of the pumps in amplifier 18 to ensure that the gain is maintained at a constant level.

As another example, an input tap may be used to measure input signal powers. The pump powers generated by the pumps in amplifier 18 may be adjusted based on the measured input power. If desired, gain transient control techniques may be used that involve input and output spectral filters. Such filters may modify the entire spectrum of the tapped input and output signals or may be used to make power measurements for a particular channel or channels. The modified measured powers or the power of the particular channel or channels may be used in a feedback control scheme or other suitable control scheme for adjusting the pump powers.

Figure 3:
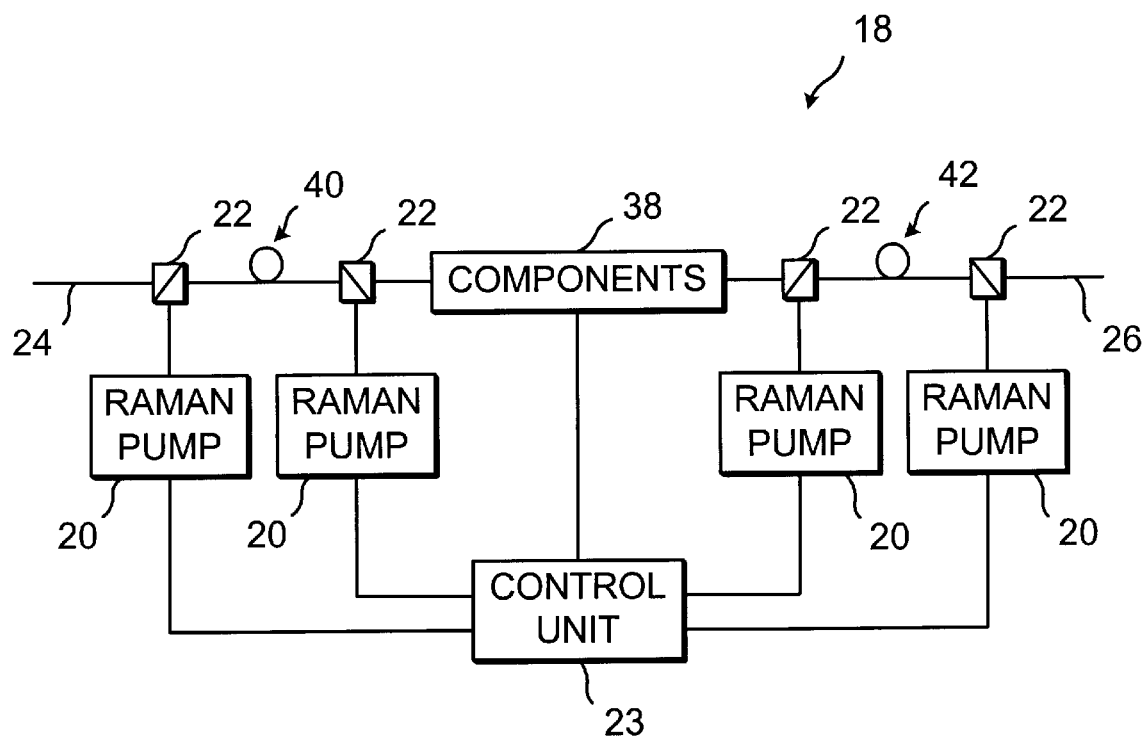
FIG. 3 is a schematic diagram of an illustrative Raman amplifier based on discrete coils of Raman-pumped fiber in accordance with the present invention.

An illustrative amplifier 18 that is based on discrete Raman-pumped fiber coils is shown in FIG. 3. In amplifier 18 of FIG. 3, optical signals may be amplified by Raman fiber coils 40 and 42. Any suitable optical fiber may be used as Raman fiber 40 and 42. For example, fiber 40 and 42 may be small-core fiber or dispersion-compensating fiber or other suitable fiber for producing Raman gain in a coil inside an amplifier or other network equipment. An advantage of using dispersion-compensating fiber for fiber coils 40 and 42 is that such fiber may compensate for chromatic dispersion on communications link 10.

Multiwavelength Raman pumps 20 of FIG. 3 are shown as being used in pumping configurations in which coils 40 and 42 are both copumped and counterpumped. This is merely illustrative. Raman pumps 20 may also be used in counterpumped configurations or in copumped configurations. Any suitable number of Raman-pumped coils may be used. If desired, other gain stages (e.g., erbium-doped fiber gain stages, semiconductor optical amplifier gain stages, etc.) may be used in combination with Raman-pumped coils such as coils 40 and 42.

Control unit 23 may control Raman pumps 20 to adjust the spectral shape of the Raman gain produced by pumps 20 and to suppress gain transients, as described in connection with FIG. 2. Control unit 23 may also be used to control Raman pumps 20 to adjust the spectral shape of the Raman gain produced by pumps 20 for different types of fiber in coils 40 and 42.

Figure 4:
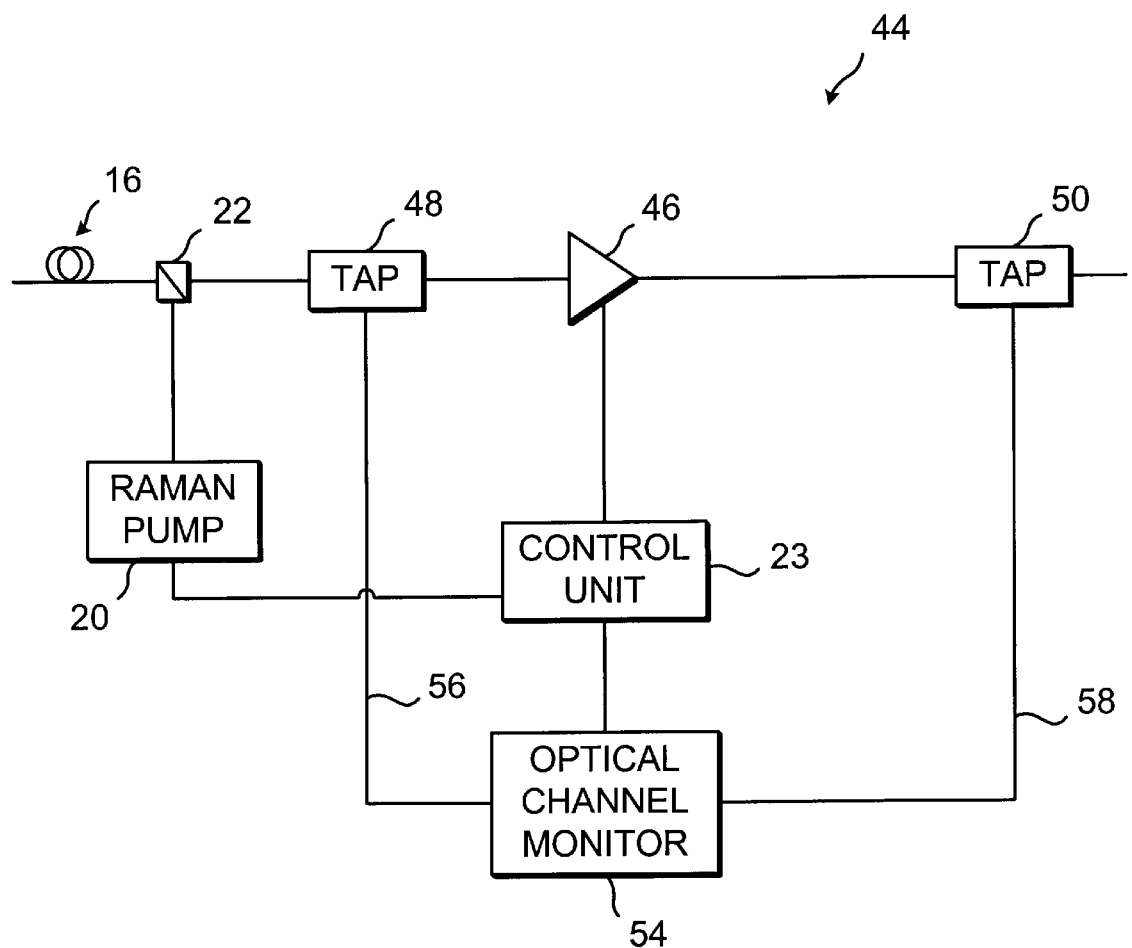
FIG. 4 is a schematic diagram of illustrative amplifier equipment having an optical channel monitor in accordance with the present invention.

As shown in FIG. 4, an optical channel monitor may be used to measure optical signals in an amplifier 18 or elsewhere along a link 10. Amplifier equipment 44 of FIG. 4 includes a multiwavelength Raman pump 20 that pumps transmission fiber 16 through pump coupler 22. Optical gain for the signals on span 16 is also provided by gain stage 46. Gain stage 46 may be an erbium-doped fiber amplifier or other suitable optical amplifier. Gain stage 46 may include discrete coils of Raman-pumped fiber that are pumped with multiwavelength Raman pumps 20. Gain stage 46 and the other equipment in FIG. 4 may be provided as a stand-alone amplifier or may be part of an amplifier or other suitable equipment.

Taps such as taps 48 and 50 may be used to tap optical signals traveling in the fiber path of equipment 44. Tapped signals may be provided to optical channel monitor 54 over fibers 56 and 58. Optical channel monitor 54 may contain spectrum analyzing equipment that measures the power of the optical signals. In the illustrative example of FIG. 4, tap 48 may be used to measure the input signal powers for stage 46 and tap 50 may be used to measure output signal powers. With this arrangement, optical channel monitor 54 may measure the gain spectrum of gain stage 46 and may measure the output power of the distributed Raman amplifier based on span 16 and Raman pump 20.

Optical channel monitor 54 may provide information on the spectrum measurements and other optical signal measurements that have been made to control unit 23. Control unit 23 may be provided as part of equipment 44 as shown in FIG. 4 or may be provided as part of an amplifier 18 or other suitable equipment. Control unit 23 may control the pump powers produced at each of the multiple pump wavelengths provided by Raman pump 20 or Raman pumps 20 in stage 46 based on the information provided by optical channel monitor 54. For example, control unit 23 may control the pump powers of such Raman pumps to adjust the Raman gain spectrum in span 16 or stage 46.

Figure 5:
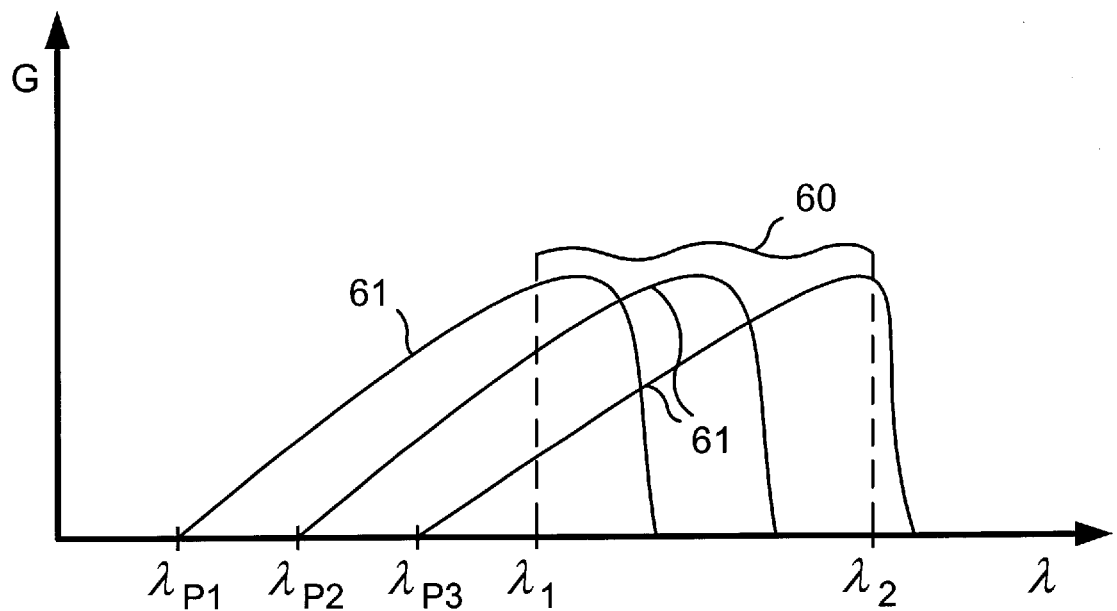
FIG. 5 is a graph of an illustrative Raman gain spectrum for a Raman amplifier pumped at three wavelengths to produce a flat gain spectrum in accordance with the present invention.

An illustrative Raman gain spectrum 60 that may be produced when a multiwavelength Raman pump 20 is used to pump a transmission fiber 16 or a coil of fiber is shown in FIG. 5. In the example of FIG. 5, three different pump wavelengths $\lambda_{P1}$, $\lambda_{P2}$, and $\lambda_{P3}$ have been used to produce spectrum 60. Each pump wavelength makes a contribution 61 to the gain spectrum 60. As shown in FIG. 5, spectrum 60 may be made relatively flat, even without using gain flattening filters. Further gain flattening may be achieved by using more pump wavelengths (e.g., using 4, 5, 6, ... 10, 11, or more different pump wavelengths). The different pump wavelengths are typically separated in wavelength by at least 1 nm or 2 nm or more typically by at least 5 nm, 10 nm, 20 nm, or more.

Figure 6:
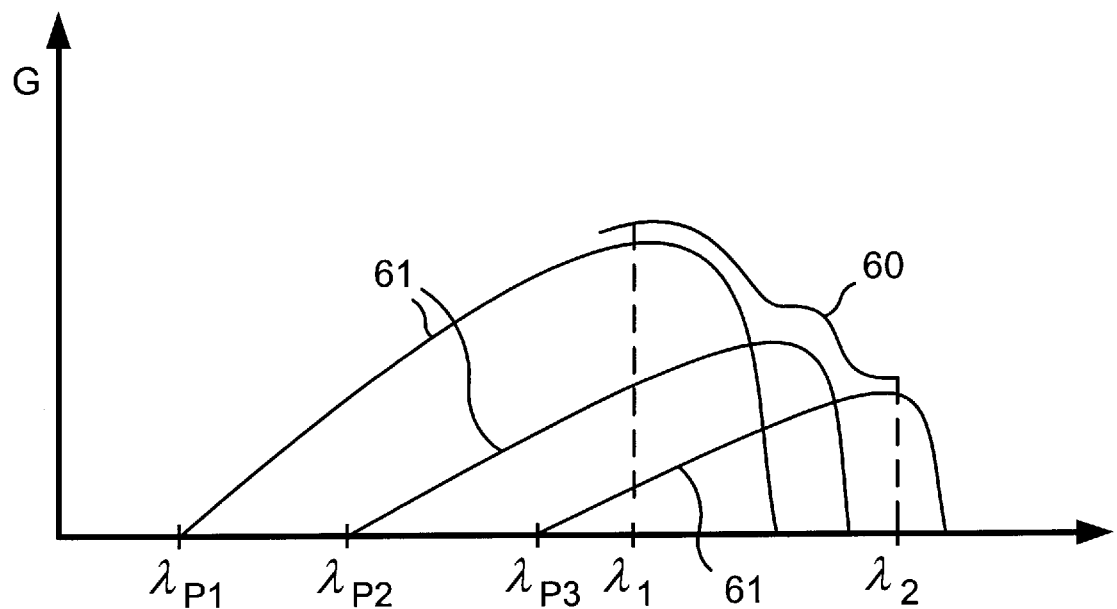
FIG. 6 is a graph of an illustrative Raman gain spectrum for a Raman amplifier pumped at three wavelengths to produce a tilted gain spectrum in accordance with the present invention.

As shown in FIG. 6, the pump powers of the different pump wavelengths may be adjusted to provide a tilted Raman gain spectrum 60, rather than the flat spectrum 60 of FIG. 5. The tilted spectrum 60 of FIG. 6 is merely illustrative. Any suitable spectral shape may be obtained by adjusting the pump powers of pump 20 if desired. Pump power tends to be transferred from shorter wavelength pumps to longer wavelength pumps due to Raman gain. If desired, these pumping effects may be taken into account when adjusting the pump powers.

Figure 7:
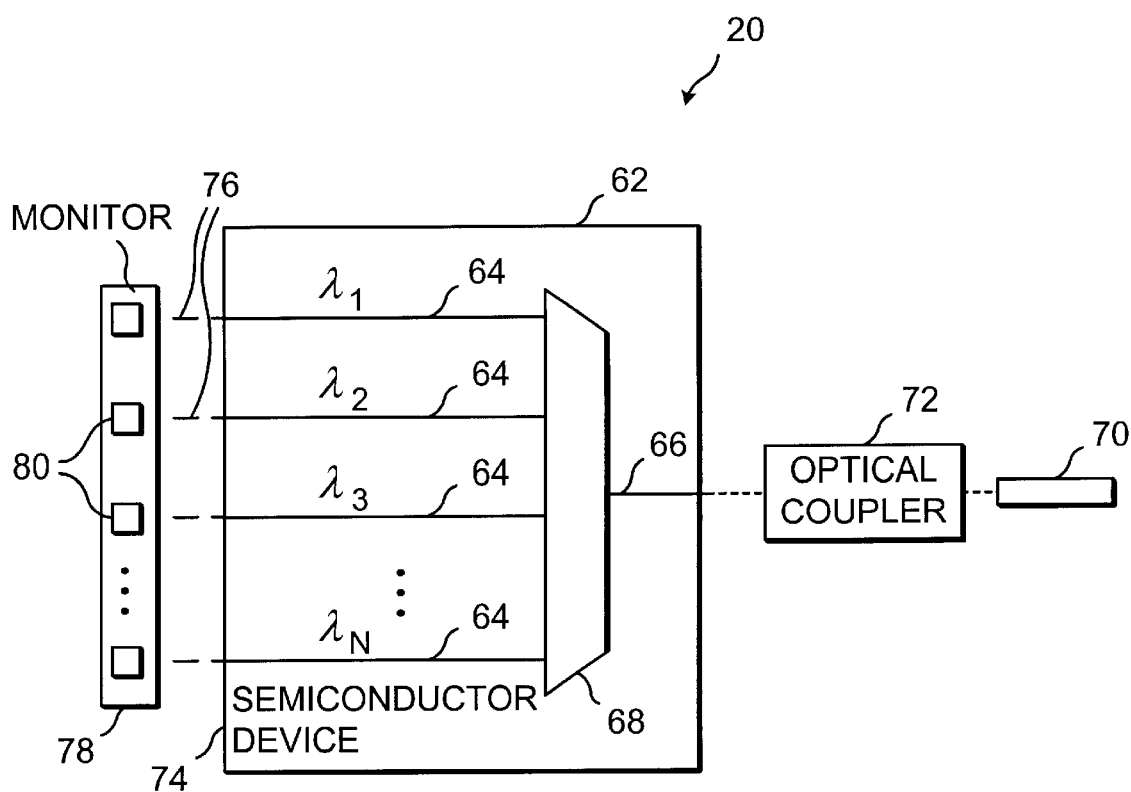
FIG. 7 is a diagram of an illustrative multiwavelength Raman pump based on a semiconductor device that produces pump light at multiple wavelengths in accordance with the present invention.

An illustrative multiwavelength Raman pump 20 is shown in FIG. 7. A semiconductor device 62 may be used to generate pump light at multiple wavelengths ($\lambda_1$, $\lambda_2$, $\lambda_3$, ... $\lambda_N$,). Semiconductor device 62 may be based on any suitable light-generating semiconductor material system. For example, semiconductor device 62 may be based on structures formed from InP, InGaAsP, InGaAlAs or other suitable semiconductors. Semiconductor device 62 may have active regions based on bulk materials, multiple quantum well (MQW) structures, quantum wires, quantum dots, or any other suitable semiconductor structures for generating pump light or combinations of such structures. Optical confinement may be provided in the vertical dimension by controlling the index of refraction of the semiconductor layers used in device 62. Lateral optical confinement may be provided using waveguide structures such as ridge waveguides or buried heterostructure waveguides.

The diagram of FIG. 7 is a top view of device 62. Waveguides are represented by lines 64 and line 66. The regions represented by lines 64 may be source regions that use gratings or other structures to produce light at particular wavelengths. The light from each of these source regions may be combined into a single path (represented by line 66) using an optical multiplexer or other suitable optical combiner 68.

Optical multiplexer 68 may be a wavelength division multiplexing (WDM) structure such as an arrayed waveguide (AWG) structure, a splitter (e.g., a multibranch Y structure), a multimode interference (MMI) structure, or any other suitable optical multiplexing structure.

Multiwavelength pump light that exits device 62 at the end of path 66 may be coupled into fiber 70 using optical coupler 72. Optical fiber 70 may be used to provide the pump light to an appropriate pump coupler 22 for pumping a fiber span 16 or coil of Raman-pumped fiber. Optical coupler 72 may be a lens, a pair of lenses with an intermediate isolator, or any other suitable lens or optical coupling system for coupling pump light exiting a waveguide at the edge of device 62 into optical fiber 70. If desired, an integral fiber lens at the tip of fiber 70 may be used as the optical coupler 72 or may be used in combination with a separate optical coupler 72 such as a lens system.

The waveguides of the source regions represented by lines 64 may extend to the back facet 74 (rear face) of semiconductor device 62. Light may exit each of the waveguides at the back facet, as indicated by dotted lines 76. A monitor 78 may be used to detect this light. Monitor 78 may be any suitable device for measuring the powers of the signals exiting device 62. For example, monitor 78 may be a photodiode array or other device having individual detectors 80, each of which measures the power exiting a respective one of the source region waveguides 64. If desired, monitor 78 may be based on a charge-coupled device or any other suitable detector arrangement.

Figure 8:
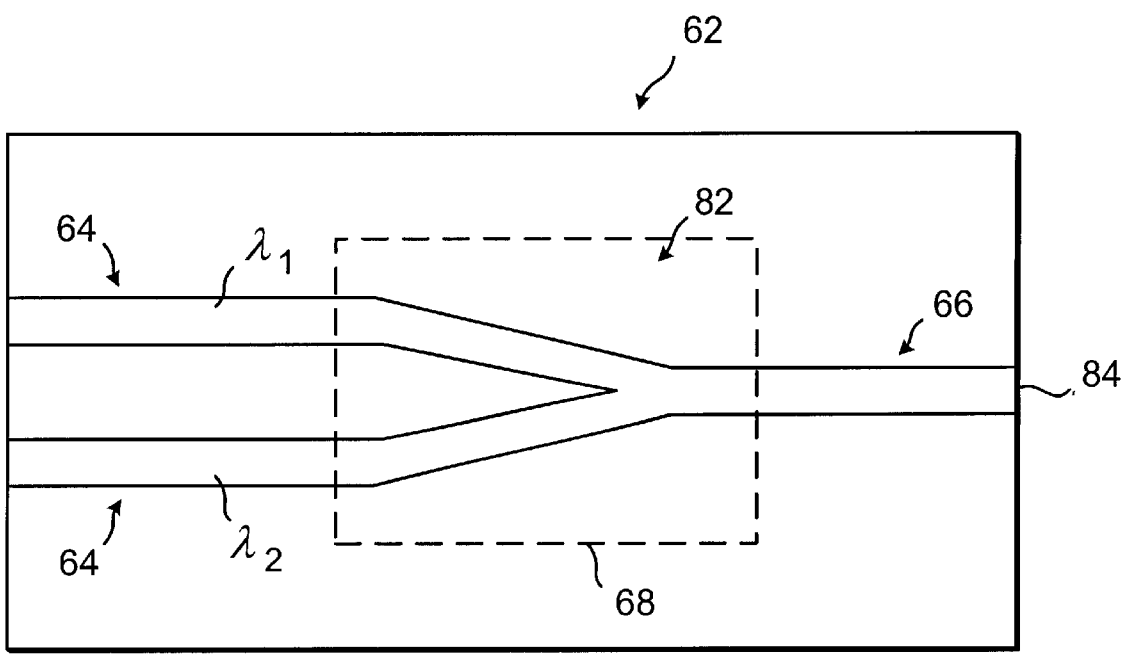
FIG. 8 is a diagram of an illustrative Y-branch coupler that may be used to combine pump light at different wavelengths on the semiconductor device in accordance with the present invention.

An illustrative semiconductor device arrangement having a multiplexer 68 based on a Y-branch waveguide structure 82 is shown in FIG. 8. Light is produced by the active semiconductor layers in source regions 64. Two source regions are shown in FIG. 8 and some of the other drawings, but any suitable number of source regions may be used. Each source region 64 may produce or handle pump light at a different pump wavelength. Structure 82 combines light from the source regions 64 and provides the combined light to waveguide structure 66. Light exits waveguide structure 66 at exit 84.

Figure 9:
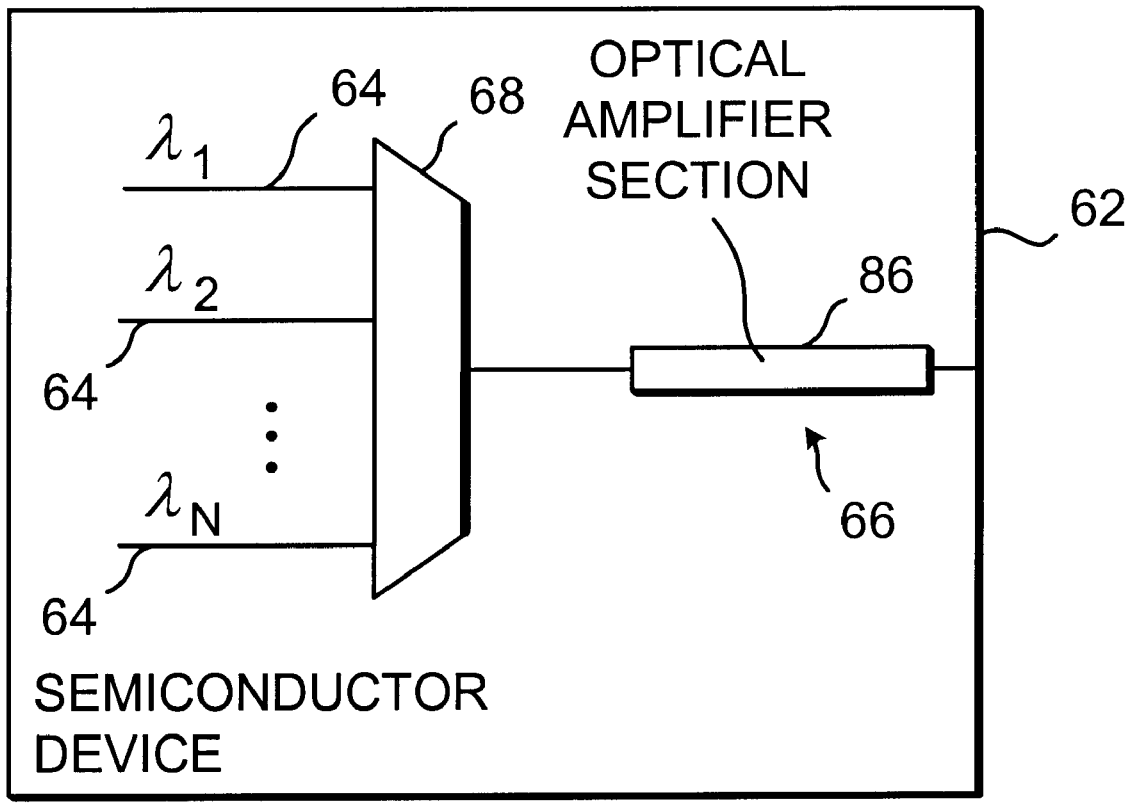
FIG. 9 is a diagram of an illustrative multiwavelength Raman pump semiconductor device that includes a semiconductor optical amplifier section for power amplification in accordance with the present invention.

As shown in FIG. 9, semiconductor device 62 may include an optical amplifier section 86 that amplifies the pump light signals at all pump wavelengths. Amplifier section 86 may be a semiconductor optical amplifier gain stage that is based on the same semiconductor active regions that are used to produce pump light in source regions 64. Amplifier section 86 may be used to simultaneously increase the power of all of the pump wavelengths from source regions 64. The drive currents used to control each of source regions 64 may be independently adjusted by control unit 23. This allows the relative pump power for each wavelength in the multiwavelength pump 20 to be adjusted independently. The drive current for amplifier section 86 may be also be independently adjusted if desired.

Figure 10:
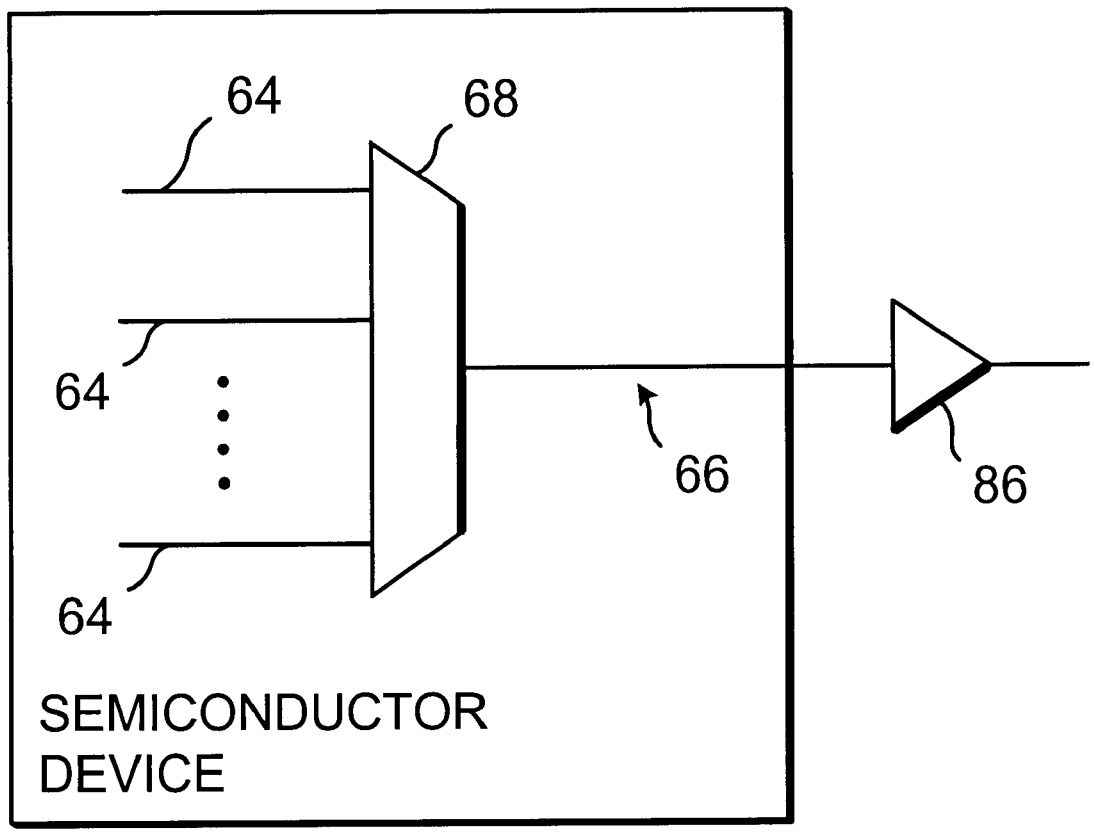
FIG. 10 is a diagram showing how a multiwavelength Raman pump may be based on a multiwavelength semiconductor source coupled to an external optical power amplifier in accordance with the present invention.

As shown in FIG. 10, an external optical amplifier stage 86 may be used to amplify the optical signals at the different pump wavelengths that are produced by source regions 64. Amplifier stage 86 may be a semiconductor optical amplifier stage, a Raman fiber amplifier stage, a rare-earth-doped fiber amplifier stage, or any other suitable amplifier stage.

Figure 11:
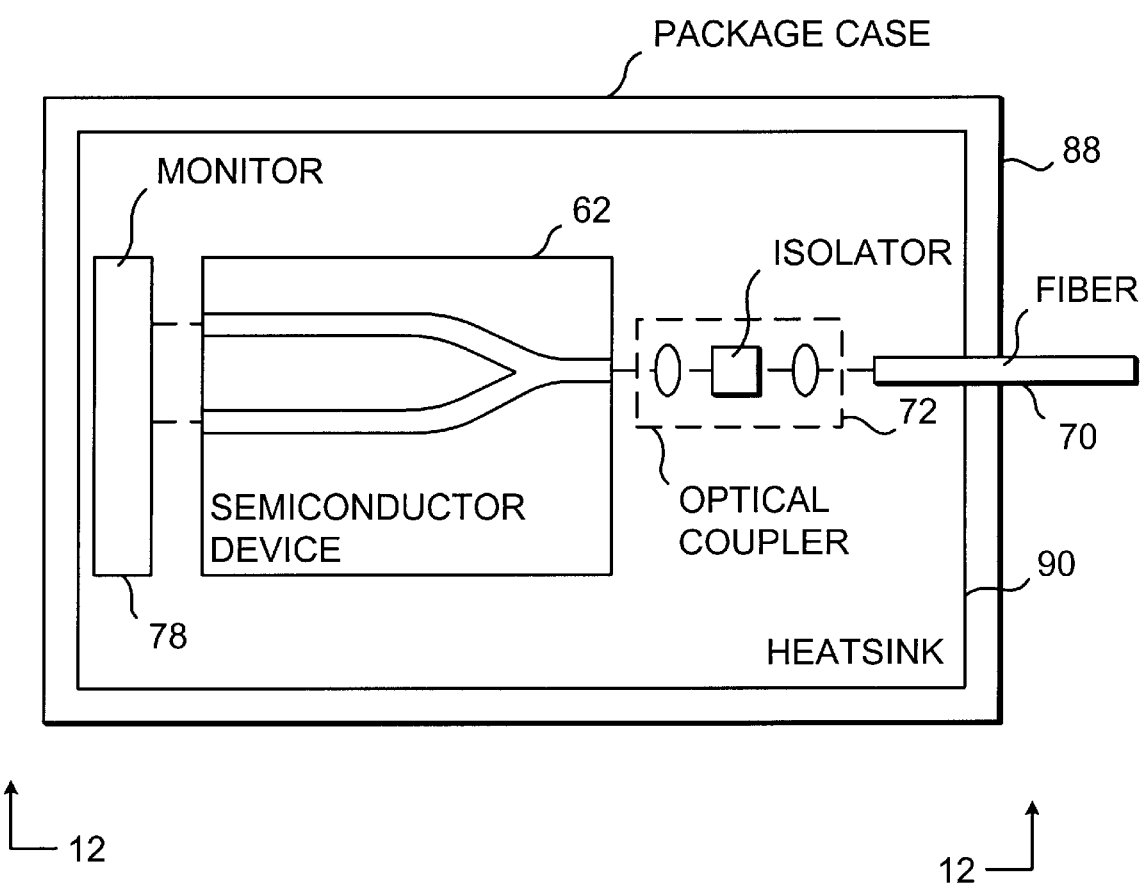
FIG. 11 is a top view of an illustrative housing arrangement for a Raman pump in accordance with the present invention.
Figure 12:
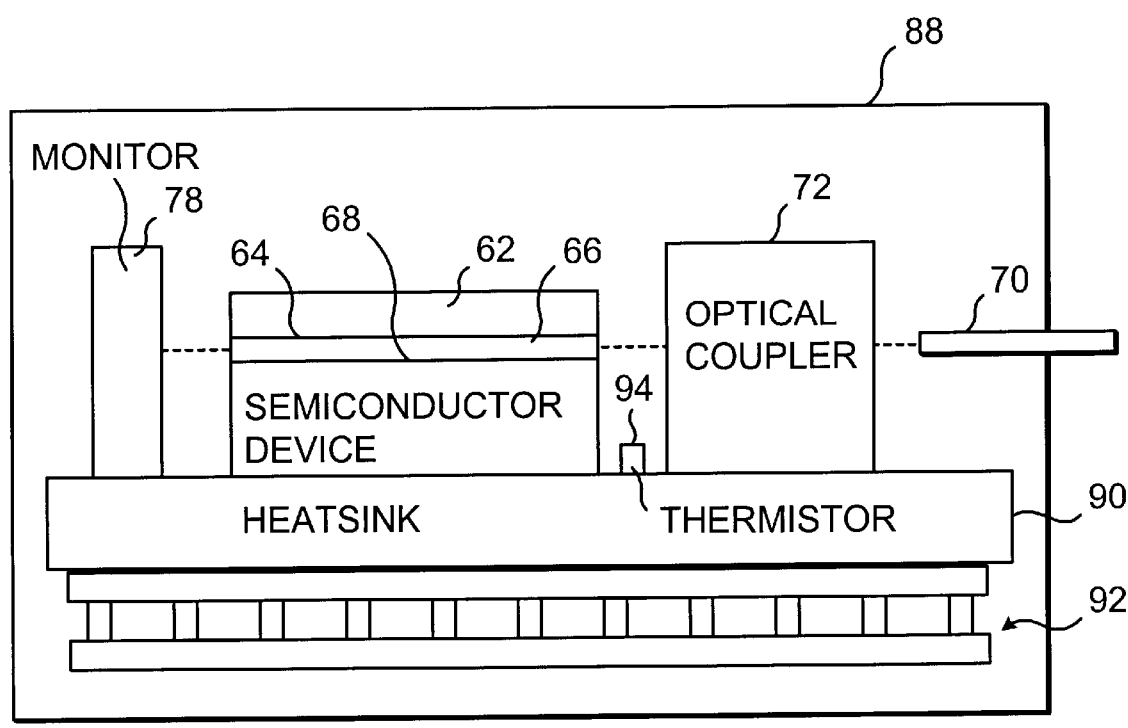
FIG. 12 is a side view of the housing arrangement of FIG. 11 taken along the line 12—12 in FIG. 11.

Any suitable housing arrangement may be used for Raman pump 20. One suitable arrangement is shown in FIGS. 11 and 12. As shown in the top view of FIG. 11, the various components of pump 20 may be housed in a package case 88. Case 88 may be formed of metal or other suitable materials. Within case 88, semiconductor device 62 may be mounted on a heatsink 90. Heatsink 90 may be formed from copper, aluminum, alumina, silicon carbide, aluminum nitride, or any other suitable heatsink materials. Heatsink 90 removes excess heat from device 62 during operation, and allows the temperature of device 62 to be controlled.

Monitor 78, optical coupler 72, and fiber 70 may also be mounted in case 88. As shown in the side view of FIG. 12, monitor 78, device 62, optical coupler 72, and fiber 70 may be mounted in vertical alignment in case 88. Most of the pump light from device 62 exits device 62 in the forward direction and is coupled into fiber 70 by pump coupler 72. A fraction of the pump light may also exit device 62 in the backwards direction for monitoring by monitor 78.

If desired, a thermoelectric cooling (TEC) element 92 may be used to heat or cool heatsink 90. If desired, a thermistor 94 or other suitable temperature sensor may be mounted on heatsink 90 or at another suitable location within the pump housing. Temperature information from thermistor 94 may be provided to control unit 23 or other suitable control electronics. This information may be used in controlling the temperature of heatsink 90 and device 62. For example, a feedback scheme may be used in which the temperature information from thermistor 94 is used to maintain the temperature of heatsink 90 at a desired level. If desired, the thermoelectric cooler may be used to adjust the temperature of device 62 to adjust the lasing wavelengths of device 62.

The light exiting semiconductor device 62 may be polarized (e.g., linearly polarized). If polarized light is used to Raman pump fiber 16 or coils 40 and 42, the Raman gain produced in the fiber may be polarization sensitive. This is generally not desired. Accordingly, a depolarization scheme may be used to depolarize the light exiting device 62 before the light is provided to fiber 70. For example, the pump light from two Raman pumps 20 may be combined with a polarization beam combiner. The combined pump light may be used to provide Raman gain with a reduced polarization dependence.

Figure 13:
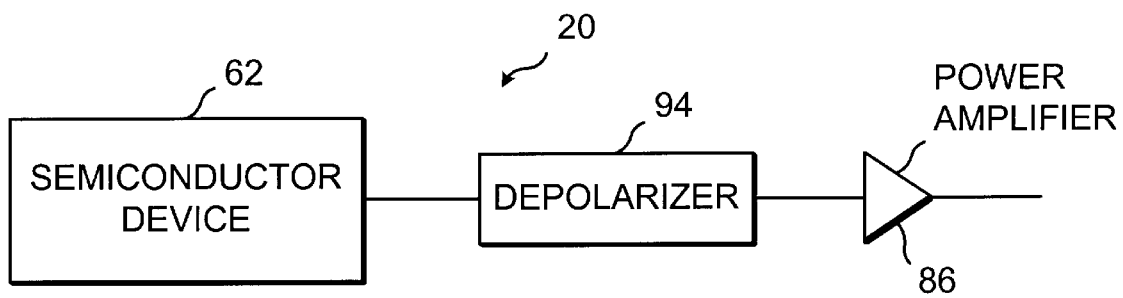
FIGS. 13–15 are schematic diagrams of illustrative arrangements for depolarizing light from a multiwavelength source in accordance with the present invention.

As shown in FIG. 13, a depolarizer 94 may be used to depolarize the light exiting device 62. Depolarizer 94 may be based on polarization maintaining fiber that is oriented at 45° with respect to the angle of the linearly-polarized light exiting device 62. With this type of arrangement, linearly-polarized light from device 62 may be launched equally along the slow and fast axes of the polarization maintaining fiber. The polarization-maintaining fiber may be long enough with respect to the coherence length of semiconductor device 62 to ensure that when the light from the slow and fast axes exits the end of the polarization-maintaining fiber and is recombined, the polarization dependence of the light is removed. This is merely one illustrative example of a suitable depolarization device that may be used to remove polarization from the light exiting device 62. Any other suitable depolarizing arrangement may be used if desired.

Figure 14:
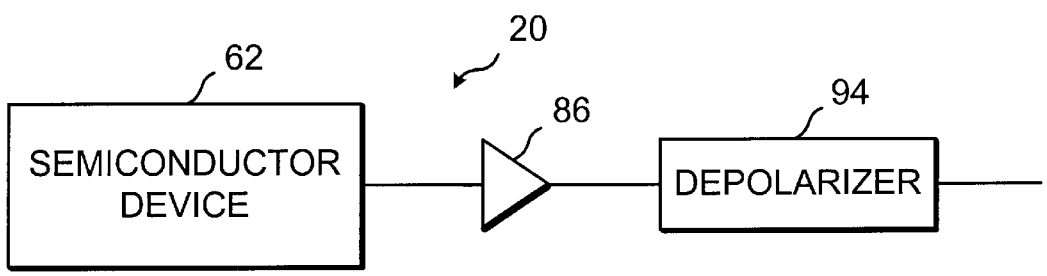

In the illustrative arrangement shown in FIG. 13, depolarizer 94 is located between device 62 and an external power amplifier stage 86. If desired, depolarizer 94 may be located after stage 86, as shown in FIG. 14.

Figure 15:
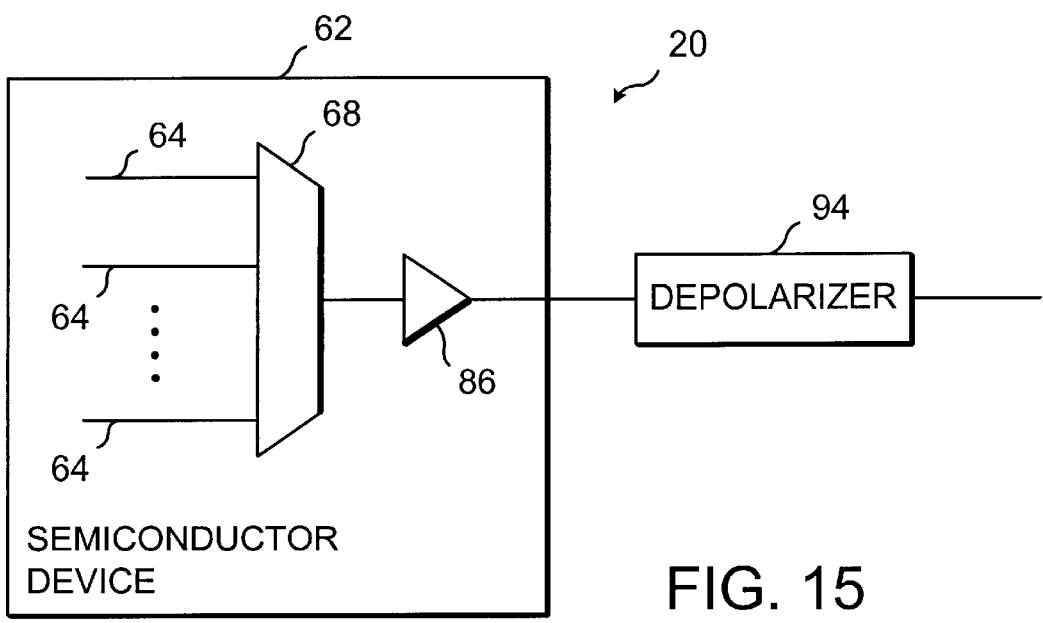

Another suitable arrangement is shown in FIG. 15. In the FIG. 15 example, power amplifier stage 86 is provided on the same semiconductor device 62 that is used to produce the pump wavelengths for pump 20. Depolarizer 94 is used to produce unpolarized light from the polarized light that exits device 62 after stage 86.

Figure 16:
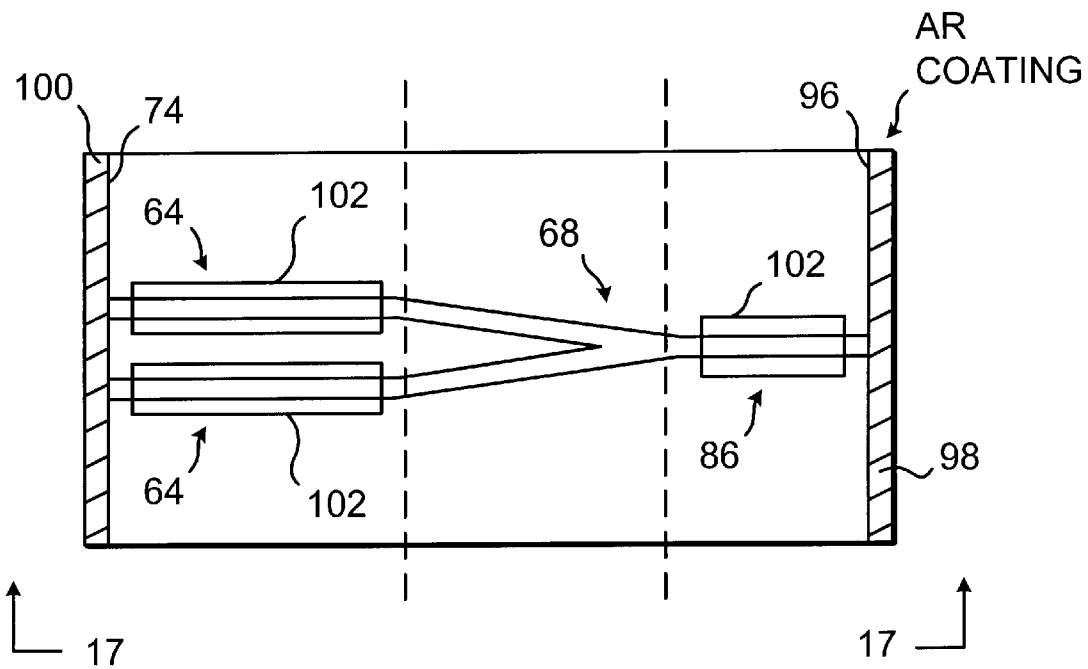
FIG. 16 is a top view of an illustrative semiconductor device having multiple waveguide sources, a Y-branch coupler, and an integral semiconductor amplifier section in accordance with the present invention.

The front and back facets of device 62 may be provided with coatings. As shown in FIG. 16, for example, the front facet 96 of device 62 may be provided with an antireflection (AR) coating 98 or other suitable low-reflectivity coating. Coating 98 may be formed from one or more dielectric layers or any other suitable coating materials. Using an AR coating 98 on front facet 96 may improve the efficiency of device 62 in providing pump light. If desired, no coating need be used on front facet 98.

Back facet 74 may be left uncoated or may be provided with a coating 100. Coating 100 may be formed from one or more dielectric layers or metal layers or any other suitable coating materials. Coating 100 may be, for example, a high-reflectivity coating that provides a broadband reflectivity of more than 80% or more than 95% or any other suitable amount of reflectivity. The high-reflectivity coating 100 may reflect light from source regions 64 back into source regions 64. Using the high-reflectivity coating on back facet 74 may therefore improve the efficiency of device 62 in generating pump light. The high-reflectivity coating on back facet 74 may also help to broaden the spectral linewidth of the pump light. This increased linewidth may tend to reduce undesirable non-linear effects such as four-wave-mixing in the Raman amplifier.

Contact pads 102 may be provided that allow drive currents to be applied to source regions 64 and amplifier section 86. The areas underlying contact pads 102 are active semiconductor regions that generate gain when driven with a current.

Figure 17:
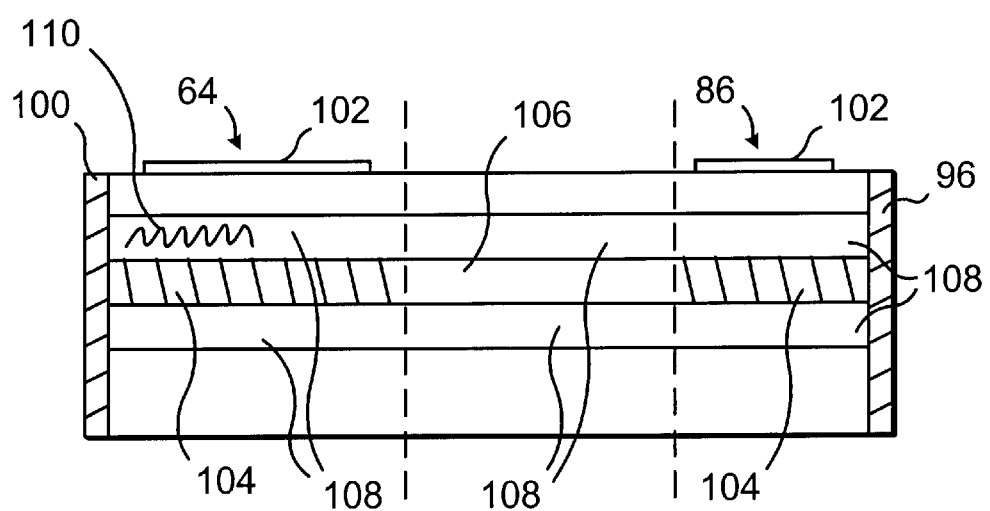
FIG. 17 is a side view of the illustrative semiconductor device of FIG. 16 taken along the line 17—17 in accordance with the present invention.

The active regions 104 are shown in the side view of FIG. 17. In some regions of device 62 such as in passive multiplexer structures 68, it may not be desired to provide an active region 104. In these regions, a passive optically-transparent layer 106 may be provided. As shown in FIG. 17, layer 106 may be used to optically guide pump light from the active regions 104 of sources 64 into the active region 104 of amplifier stage 86. Layer 106 may be formed using any suitable technique such as by masking regions 104, etching the masked device 62, depositing layer 106, and removing the masks.

Waveguide cladding layers 108 may be provided above and below active regions 104 and layer 106 to provide vertical optical confinement. The index of refraction of layers 104 and 106 may be relatively constant or may be graded. Layers 108 may have lower indices of refraction than layers 104 and 106. Layers 108, 104, and 106, may be based on InP, InGaAsP, InGaAlAs or other suitable semiconductor material systems. Layer 106 may be based on a discrete waveguide or other components that are bonded to semiconductor device 68 to guide the pump light.

Gratings such as gratings 110 may be provided for each source region 104. The gratings may be provided, for example, in cladding layers such as layers 108. The gratings typically are formed at the interface between two layers with different indices of refraction. Gratings may also be formed by creating periodic structures in the semiconductor that modify or create gain in the semiconductor in a periodic pattern.

The gratings 110 may be different for each source region 64. The grating 110 that is associated with a particular source region helps define the wavelength of light that is produced by that source region during operation of device 62.

Each period in a grating 110 forms a source of feedback for light in the associated source region 64. Although the reflection from any one period of grating 110 is relatively small, the combined effect of each of the multiple periods in grating 110 produces a substantial reflection from grating 110 at the desired wavelength for that source region 64. Gratings 110 may be distributed Bragg grating reflectors, full or partial distributed feedback gratings, or any other suitable grating structures.

Figure 18:
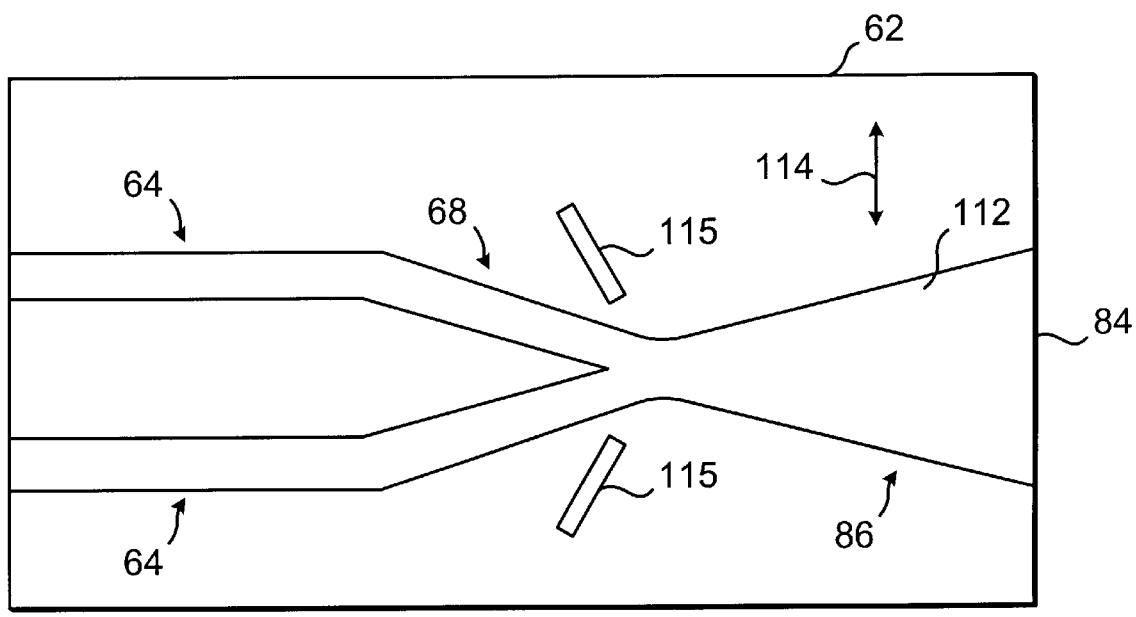
FIG. 18 is a top view of an illustrative multiwavelength semiconductor source having a semiconductor optical amplifier region with a flared waveguide shape in accordance with the present invention.

As shown in FIG. 18, semiconductor device 62 may have an amplification stage 86 that is based on an adiabatically-tapered waveguide structure or a flared gain structure 112 (e.g., a structure using a flared contact pad without using lateral waveguide confinement). Structure 112 may be flared by an amount (e.g., a 6 degree angle) that allows light from multiplexer region 68 to expand in horizontal dimension 114 as the light propagates from multiplexer 68 to output 84. The light passing along the flared portion 112 may expand freely in lateral dimension 114 at the same or nearly the same rate as light would expand in a uniform semiconductor, because flared portion 112 need not have waveguide regions to provide lateral confinement. Cavity spoilers 115 may be used to block light traveling in the backwards direction.

Figure 19:
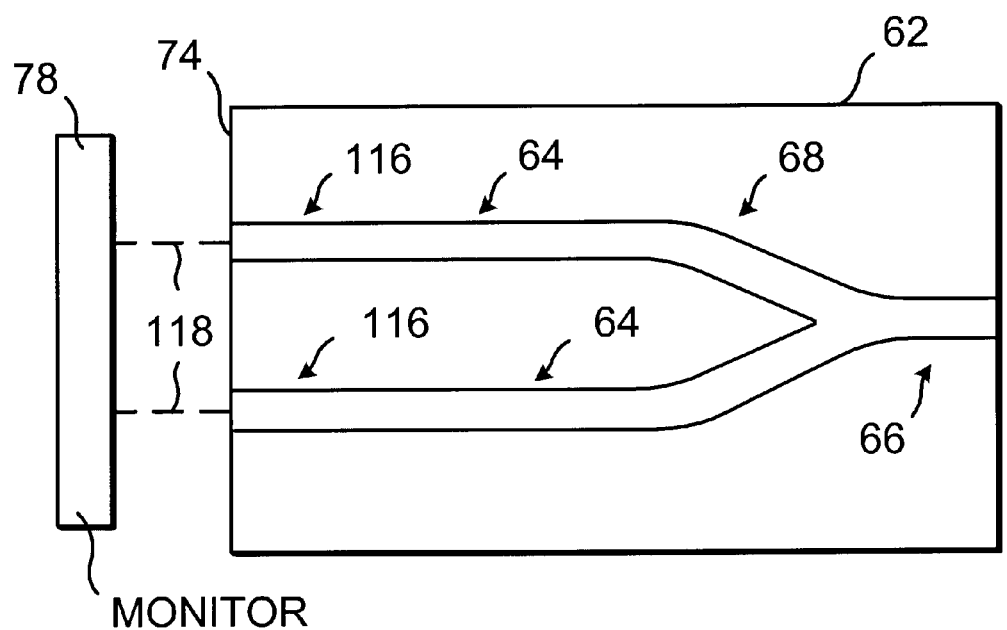
FIG. 19 is a top view of an illustrative semiconductor device in which the waveguide source regions extend to the rear facet of the device to provide back facet monitoring capabilities in accordance with the present invention.

As shown in FIG. 19, the ends 116 of source region 64 may abut back facet 74 at right angles, so that light exiting back facet 74 may pass to monitor 78 along paths such as the paths shown by dotted lines 118.

Figure 20:
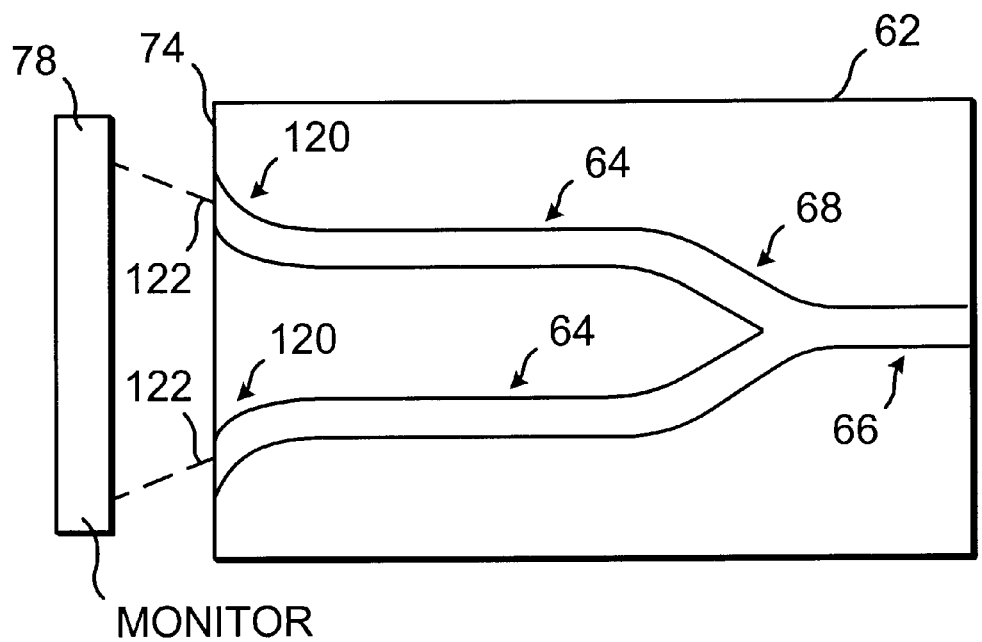
FIG. 20 is a top view of an illustrative semiconductor device in which the waveguide source regions extend to the rear facet of the device and are curved to provide back facet monitoring capabilities without introducing crosstalk between the source regions in accordance with the present invention.

If desired, angled ends 120 may be used for source regions 64, as shown in FIG. 20. With this type of approach, the ends of source regions 64 abut back facet 74 at oblique angles, so that light exiting back facet 74 of device 62 may pass to monitor 78 along paths such as the paths shown by dotted lines 122 to avoid crosstalk between different detector portions of monitor 78.

Figure 21:
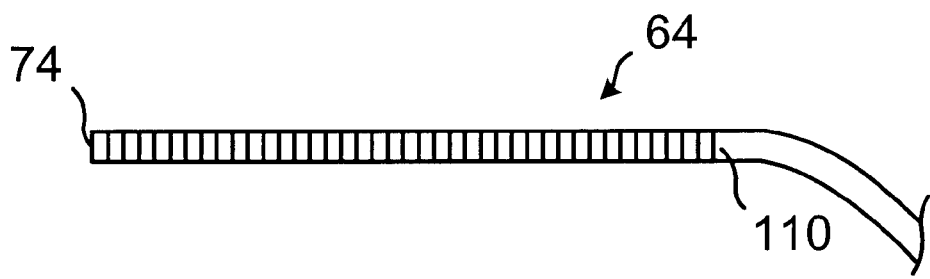
FIG. 21 is a diagram of an illustrative waveguide source region that provides pump light using a full length grating region in accordance with the present invention.
Figure 22:
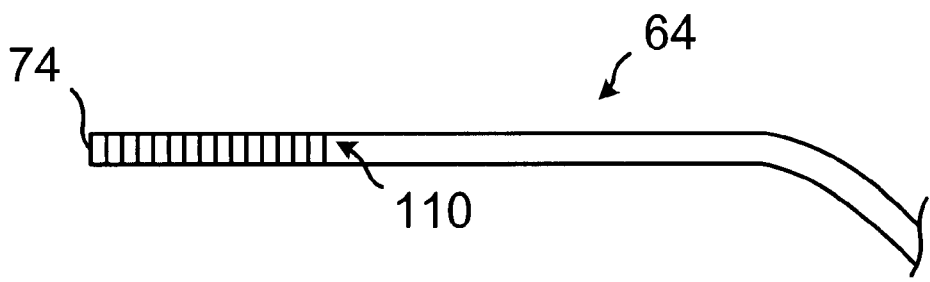
FIG. 22 is a diagram of an illustrative waveguide source region that provides pump light using a partial grating region that is at the rear of the waveguide source region in accordance with the present invention.
Figure 23:
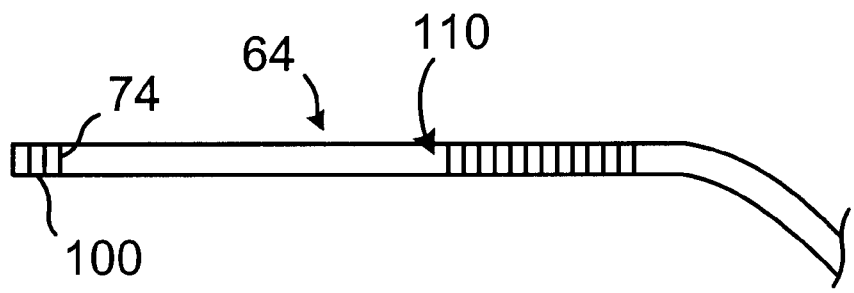
FIG. 23 is a diagram of an illustrative waveguide source region that provides pump light using a partial grating region that is at the output of the waveguide source region in accordance with the present invention.

The gratings 110 that may be used to define the different pump wavelengths produced by source regions 64 may be provided along the entire length of the source regions 64, as shown in FIG. 21. The back facet 74 may be uncoated. If desired, gratings 110 may be provided at the back facet end of regions 64, as shown in FIG. 22. The back facet 74 in the FIG. 22 arrangement may be uncoated. Another suitable arrangement involves providing gratings 110 near the front of the source regions 64, as shown in FIG. 23. With this approach, back facet 74 may be uncoated or may be coated with a high-reflectivity coating 100.

Figure 24:
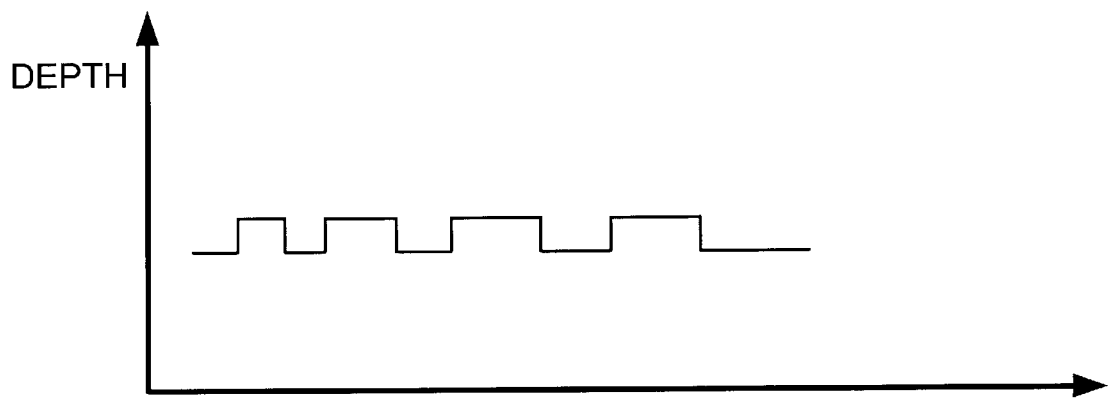
FIG. 24 is a graph showing how a chirped grating may be used in the multiwavelength semiconductor device in accordance with the present invention.

Gratings 110 may have equal periods. Gratings may also be chirped (i.e., provided with different periods). A graph showing the varying periodicity of an illustrative chirped grating is shown in FIG. 24. In the graph of FIG. 24, the grating depth (the vertical height of the grating perpendicular to the surface of device 62) is plotted as a function of the distance along the grating (parallel to the waveguide defining the associated source region 64). The period of the grating is not constant, but varies as a function of position. As a result, different wavelengths of light are reflected from different portions of grating 110.

Figure 25:
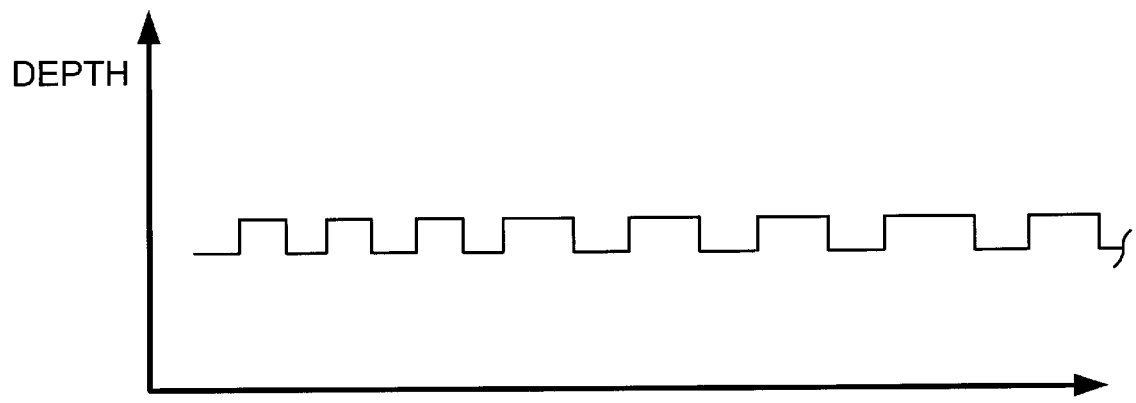
FIG. 25 is a graph showing another type of chirped grating that may be used in the multiwavelength semiconductor device in accordance with the present invention.

As shown in FIG. 25, a chirped grating may be provided in which multiple periods of the grating have substantially the same period. The period of the illustrative grating 110 of FIG. 25 is the same for each group of three periods. If desired, a larger or smaller number of periods may be repeated in grating 110.

Figure 26:
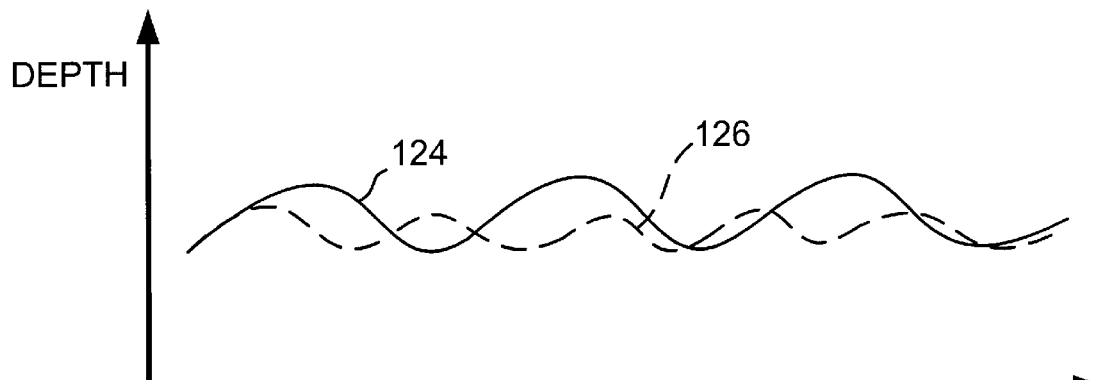
FIG. 26 is a graph showing how a grating may be provided for the multiwavelength semiconductor device using multiple grating patterns in accordance with the present invention.

Another approach for providing a chirped grating characteristic is illustrated in FIG. 26. With this approach, one mask or interference pattern is used to etch or otherwise impress the grating pattern 124 on the grating 110 and another mask or interference pattern is used to etch or otherwise impress the grating pattern 126 on the grating 110. The patterns 124 and 126 may be impressed on the grating at the same time (e.g., when the patterns result from interference patterns created by light) or sequentially (e.g., when the patterns result from using masks). The resulting grating 110 has a reflection characteristic that is a combination of the reflection characteristics associated with patterns 124 and 126. Although two patterns are shown as being combined in the example of FIG. 26, any suitable number of patterns may be combined if desired.

Figure 27:
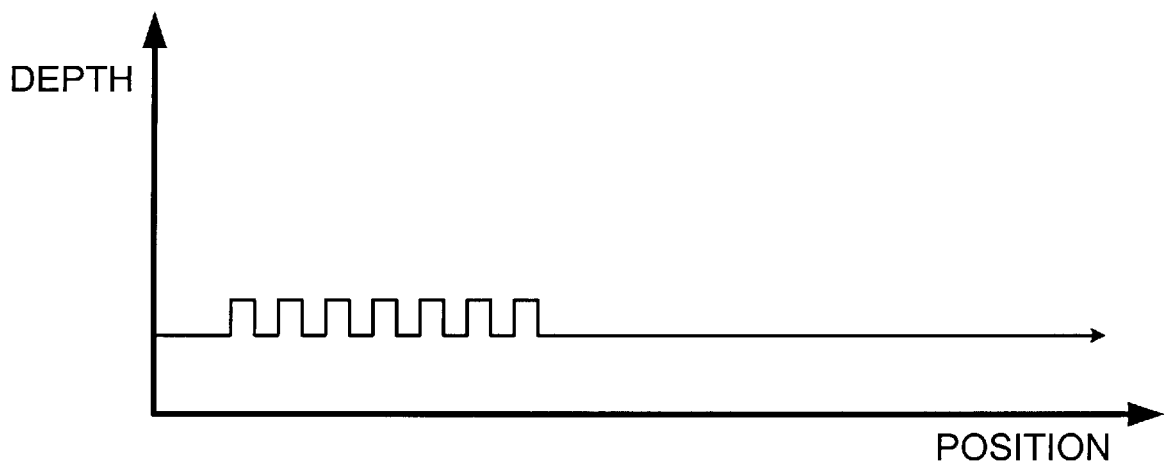
FIG. 27 is a graph showing how short gratings may be used in the semiconductor device source regions of the multiwavelength Raman pump in accordance with the present invention.

As shown by the graph of FIG. 27, a grating 110 may be provided that has a relatively small number of periods (e.g., 3–30 periods). Using a grating with a relatively small number of periods may create a spectrally-broad reflection or feedback characteristic and a correspondingly broad spectrum of light may be emitted from source region 64. Such broad spectral characteristics may be desirable for Raman pumping schemes, because sources with narrow spectral characteristics may give rise to non-linear effects in the pumped fiber such as stimulated Brillouin scattering or four-wave-mixing.

Figure 28:
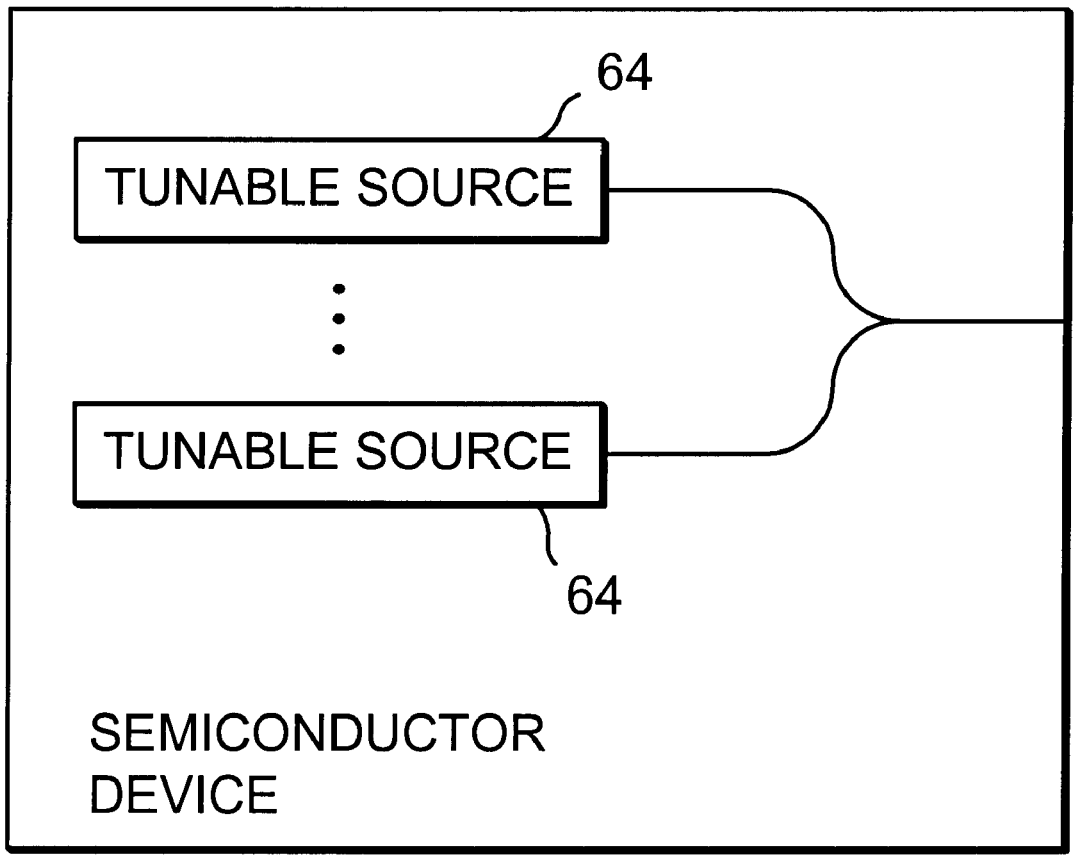
FIG. 28 is a diagram showing how a semiconductor device for the multiple wavelength Raman pump may use multiple tunable sources in accordance with the present invention.

A semiconductor device 62 for the multiple wavelength Raman pump 20 may use multiple tunable sources 64, as shown in FIG. 28. Each tunable source region 64 may be tuned to produce a different wavelength of light.

Figure 29:
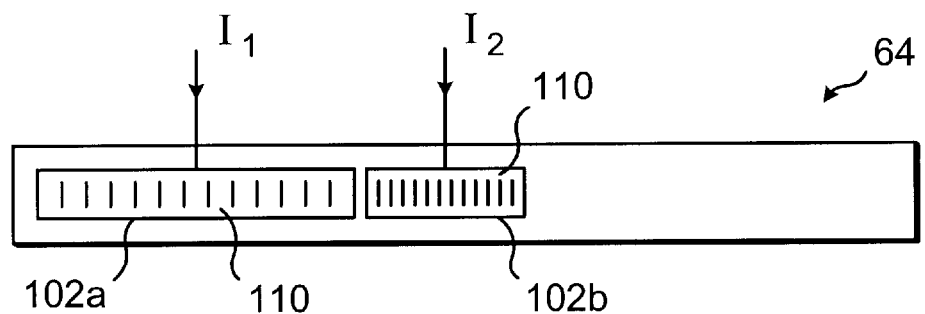
FIG. 29 is a diagram of an illustrative tunable source based on two grating regions that are independently controlled in accordance with the present invention.

A diagram of an illustrative tunable source 64 based on two grating regions that are independently controlled is shown in FIG. 29. The periodicity of the grating 110 underlying each pad 102 may be different, which allows either grating region to be activated by applying the appropriate drive current to pads 102.

With the illustrative configuration of FIG. 29, a current $I_1$, may be applied to region 64 when it is desired to create gain under pad 102a. A current $I_2$ may be applied to region 64 when it is desired to create gain under pad 102b.

Figure 30:
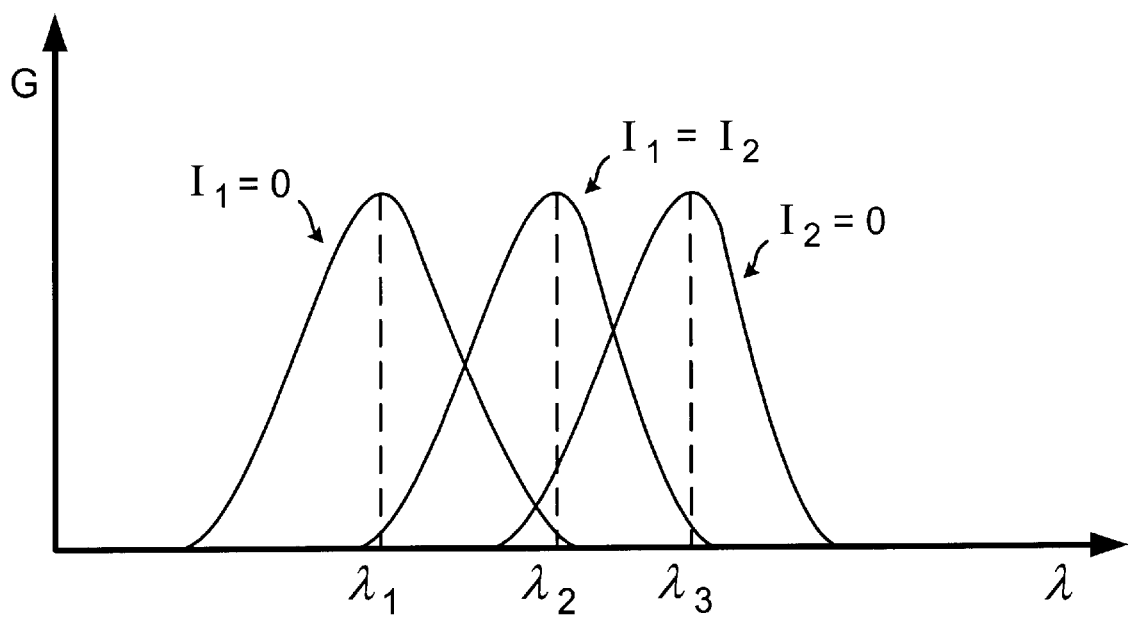
FIG. 30 is a graph showing how the wavelength of light that is produced by the tunable source of FIG. 29 depends on the relative drive currents for each of the independently-controllable source regions of FIG. 29.

The resulting gain spectra for source region 64 of FIG. 29 for various different combinations of currents $I_1$, and $I_2$ is shown in FIG. 30. As shown in FIG. 30, the wavelength of light that is produced by the tunable source of FIG. 29 depends on the relative drive currents for each of the independently-controllable portions of source region 64 of FIG. 29.

Figure 31:
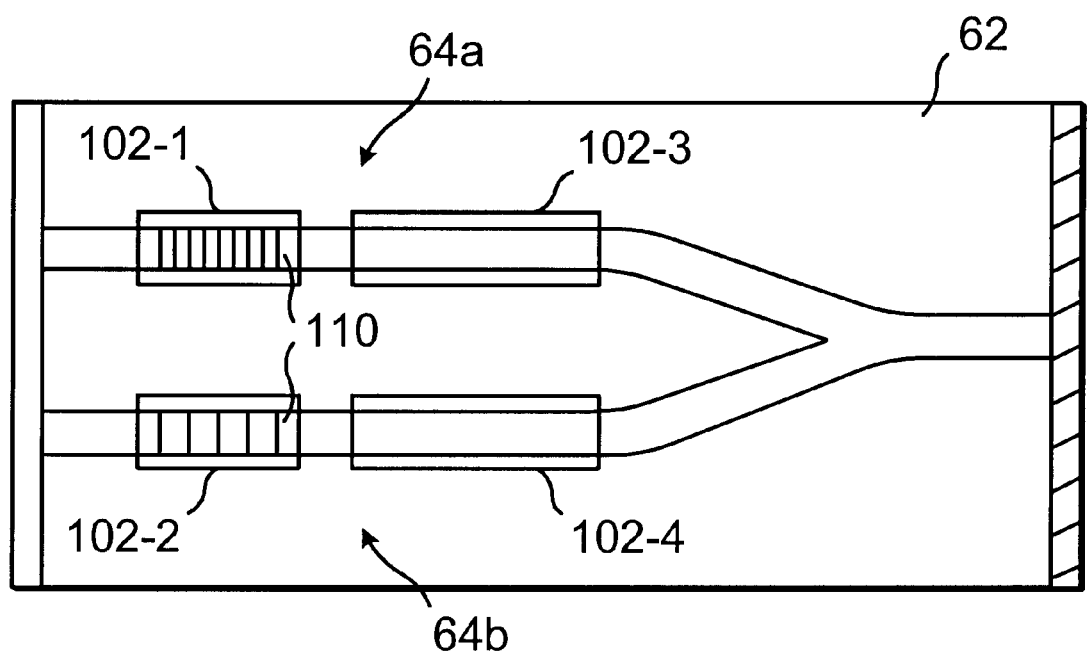
FIG. 31 is a top view of an illustrative semiconductor device having multiple waveguide source regions each of which may use a grating of a different periodicity to provide pump light at a different wavelengths in accordance with the present invention.

Another suitable configuration for a multiple-wavelength pump based on tunable source regions 64 is shown in FIG. 31. In the example of FIG. 31, each tunable source region 64 may be based on a grating 110 with a different periodicity or with the same periodicity. Light may be generated by source region 64a by applying current to a portion of source region 64a through contact pad 102-3. Light may be generated by source region 64b by applying current through contact 102-4. The wavelengths of light that are generated by source regions 64a and 64b are determined by the periodicity of the corresponding grating 110. The wavelengths of light that are generated by source regions 64a and 64b can be tuned by adjusting the current applied through pads 102-1 and 102-2, respectively.

Although structures such as device 62 of FIG. 31 are shown with only two source regions 64, this is merely illustrative. Any suitable number of source regions 64 may be provided if desired.

Figure 32:
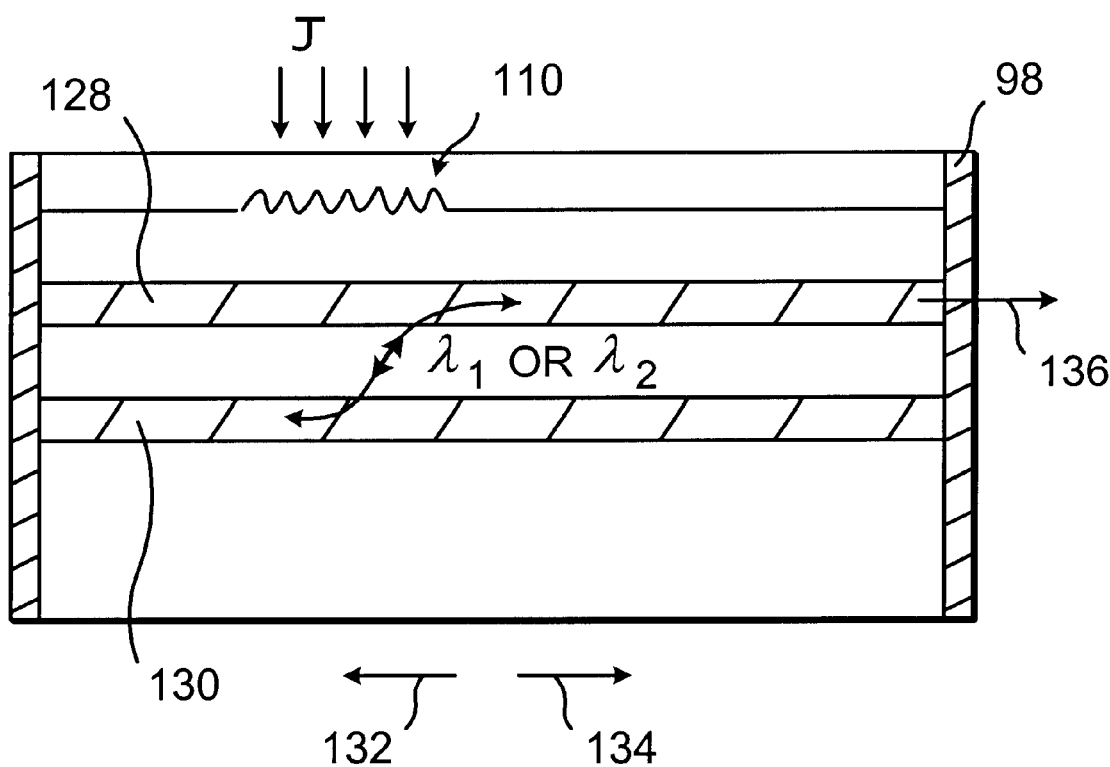
FIG. 32 is a side view of an illustrative tunable source based on multiple waveguide layers in accordance with the present invention.

A side view of an illustrative tunable source region 64 based on multiple waveguide layers 128 and 130 is shown in FIG. 32. Source region 64 may be one of source regions 64a and 64b in FIG. 31 or may be one of a group of source regions, each of which has a grating 110 with the same periodicity.

As shown in FIG. 32, a current J may be applied in the vicinity of grating 110. The magnitude of current J may be adjusted to alter the index of refraction surrounding grating 110 so that light at either wavelength $\lambda_1$ or $\lambda_2$ is coupled from waveguide layer 128 into waveguide layer 130 by grating 110. Residual light that is passing through layer 128 past grating 110 in direction 132 at the desired and undesired wavelengths is absorbed by layer 128, because layer 128 provides optical absorption in the absence of current J. The light at the desired wavelength ($\lambda_1$ or $\lambda_2$) that is coupled into waveguide layer 130 is reflected back in direction 134 by reflective coating 100, because waveguide 130 does not absorb light at wavelengths $\lambda_1$ and $\lambda_2$. In the vicinity of grating 110, grating 110 couples this light back from layer 130 into layer 128. This light may exit device 62 through antireflection coating 98 (or other suitable low-reflectivity coating), as indicated by arrow 136.

Figure 33:
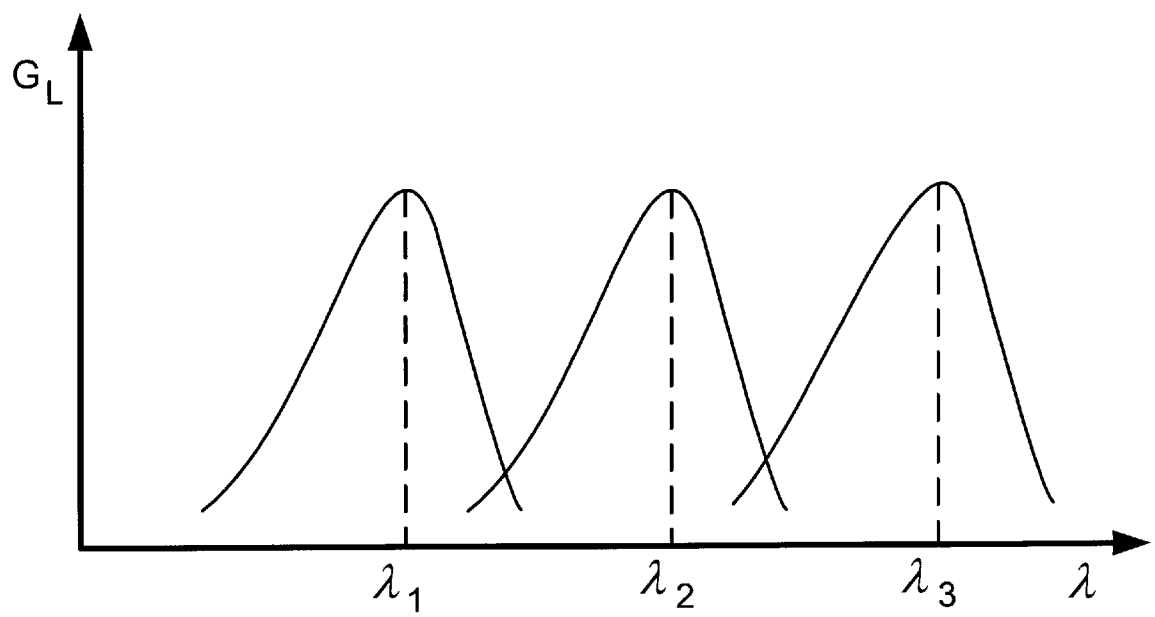
FIG. 33 is a graph of an illustrative gain spectrum that may be produced by an active region that includes three different groups of multiple quantum wells in accordance with the present invention.

The spectra produced by pump 20 may be adjusted by controlling the thicknesses and material compositions of the multiple quantum wells or other structures in each source region 64. A graph of an illustrative gain spectrum that may be produced by an active region in a region 64 that includes three different groups of multiple quantum wells is shown in FIG. 33. A region 64 with the spectrum of FIG. 33 may be tuned to produce light at a wavelength of $\lambda_1$, $\lambda_2$, or $\lambda_3$. A multiple quantum well structure or other structure that produces a spectrum of the type shown in FIG. 33 may therefore be used as the active layer in a device 62 having source regions 64 each of which has a grating or other structure that restricts the emitted light that is associated with that source region 64 to $\lambda_1$, $\lambda_2$, or $\lambda_3$, respectively.

Figure 34:
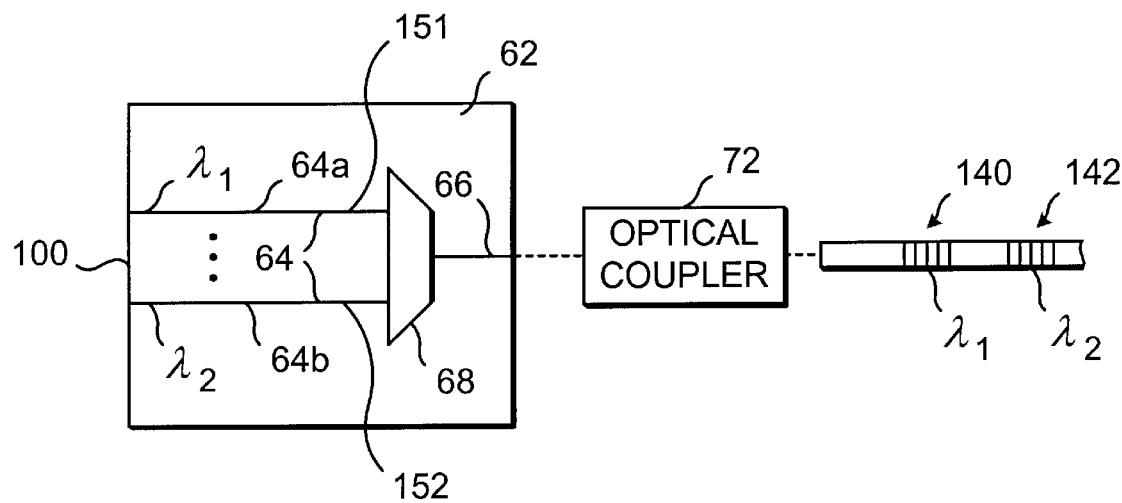
FIG. 34 is a schematic diagram of an illustrative multi-wavelength Raman pump based on a semiconductor device with multiple source regions and an external fiber Bragg grating filter in accordance with the present invention.

An external cavity or coupled-cavity arrangement may be used to selectively produce pump light at different pump wavelengths, as shown in FIG. 34. In the example of FIG. 34, light from device 62 is coupled into a fiber 138 having gratings 140 and 142 by optical coupler 72 (e.g., a lens or an optical coupler that is integral with the tip of fiber 138). Gratings 140 and 142 (e.g., fiber Bragg gratings) reflect a small amount of light at appropriate wavelengths back into waveguide 66. Multiplexer 68 directs light at each wavelength into an appropriate source region 64. Light exiting each source region 64 is coupled into waveguide 66 by multiplexer 68.

Figure 35:
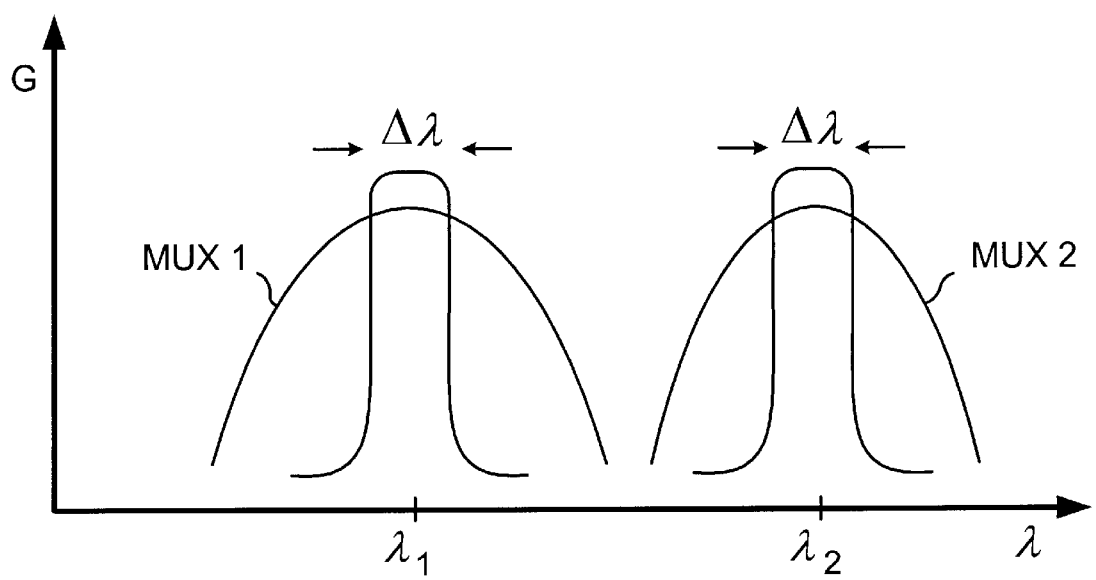
FIG. 35 is a graph showing how the arrangement of FIG. 34 may be used to ensure that the Raman pump produces pump light at the wavelengths determined by the fiber Bragg grating in accordance with the present invention.

A graph showing how the arrangement of FIG. 34 may be used to ensure that Raman pump 20 produces pump light at the wavelengths $\lambda_1$, and $\lambda_2$ determined by the gratings 140 and 142 is shown in FIG. 35. The spectrum labeled MUX 1 corresponds to the multiplexer pass band associated with a first leg 151 of multiplexer 68 (or a set of such legs). The spectrum labeled MUX 2 corresponds to the pass band of a second leg 152 of multiplexer 68 (or a set of such legs). As shown in FIG. 35, gratings 140 and 142 have bandwidths of $\Delta\lambda$ about the desired wavelengths $\lambda_1$, and $\lambda_2$. These wavelengths lie within the pass bands of the legs of multiplexer 68. As a result of the wavelength selectivity of filters 140 and 142 and the wavelength selectivity of multiplexer 68, the light produced by source regions 64a and 64b and therefore by pump 20 is centered around $\lambda_1$ and $\lambda_2$ with bandwidths $\Delta\lambda$.

Figure 36:
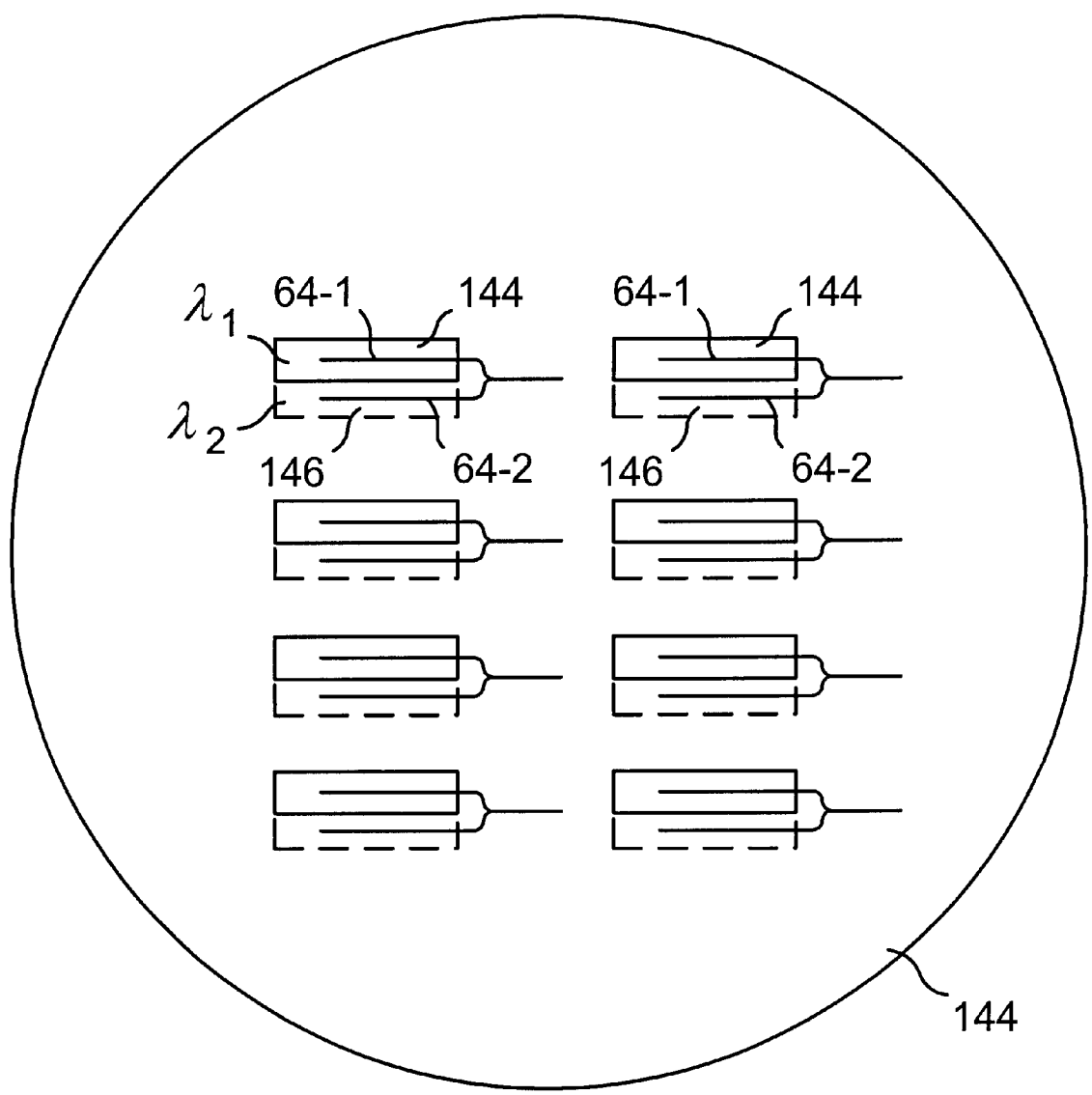
FIG. 36 is a diagram showing how a wafer of multiwavelength Raman pump semiconductor devices may be fabricated in accordance with the present invention.

Semiconductor patterning techniques may be used to manufacture wafers of devices 62 with different source regions 64. An example is shown in FIG. 36. A pattern may be formed on wafer 144 that opens mask holes 144 overlying source regions 64-1. After gratings 110 are formed through holes 144, holes 144 may be covered and holes 146 may be opened that overlie source regions 64-2. Gratings 110 of a different periodicity than the gratings 110 formed through holes 144 may then be formed. This approach may be repeated to form any suitable number of source regions 64 having different gratings or other structures. Any suitable masking techniques may be used to form mask holes such as holes 144 and 146. For example, such holes may be formed in mask layers formed from oxides, glasses, photoresists, metals, polymers, etc. Moreover, the example of FIG. 36 is merely illustrative. Any suitable semiconductor fabrication techniques may be used to pattern the waveguides, gratings, contact pads, and other structures associated with devices 62 of pumps 20.

It will be understood that the foregoing is merely illustrative of the principles of this invention, and that various modifications can be made by those skilled in the art without departing from the scope and spirit of the invention.

What is claimed is:

1. A multiwavelength Raman pump that pumps optical fiber in a fiber-optic communications network to produce Raman gain for optical signals, comprising:

a semiconductor device that produces Raman pump light at multiple different pump wavelengths for pumping the fiber; and an optical coupler for coupling the pump light into a fiber, wherein the semiconductor device has a back facet through which a portion of the pump light at each of the multiple pump wavelengths exits, the pump further comprising a monitor for monitoring the portion of the pump light that exits the back facet.

2. A multiwavelength Raman pump that pumps optical fiber in a fiber-optic communications network to produce Raman gain for optical signals, comprising:

a semiconductor device that produces Raman pump light at multiple different pump wavelengths for pumping the fiber; and an optical coupler for coupling the pump light into a fiber, wherein the semiconductor device has a back facet through which a portion of the pump light at each of the multiple pump wavelengths exits at a oblique angle, the pump further comprising a monitor for monitoring the portion of the pump light that exits the back facet.

3. A multiwavelength Raman pump that pumps optical fiber in a fiber-optic communications network to produce Raman gain for optical signals, comprising:

a semiconductor device that produces Raman pump light at multiple different pump wavelengths for pumping the fiber;

an optical coupler for coupling the pump light into a fiber; and a depolarizer that depolarizes the Raman pump light from the semiconductor device.

4. A multiwavelength Raman pump that pumps optical fiber in a fiber-optic communications network to produce Raman gain for optical signals, comprising:

a semiconductor device that produces Raman pump light at multiple different pump wavelengths for pumping the fiber;

an optical coupler for coupling the pump light into a fiber; and an external power stage that optically amplifies the Raman pump light from the semiconductor device.

* * * * *